(12) United States Patent
Takemura

(10) Patent No.: US 8,175,552 B2
(45) Date of Patent: May 8, 2012

(54) FILTER CIRCUIT, WIRELESS TRANSMITTER, AND WIRELESS RECEIVER

(75) Inventor: Gaku Takemura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 481 days.

(21) Appl. No.: 12/404,516

(22) Filed: Mar. 16, 2009

(65) Prior Publication Data

US 2009/0291652 A1 Nov. 26, 2009

(30) Foreign Application Priority Data

May 20, 2008 (JP) ................ 2008-131837

(51) Int. Cl.
*H04B 1/04* (2006.01)
*H04B 1/16* (2006.01)

(52) U.S. Cl. ............ 455/118; 455/323; 327/361

(58) Field of Classification Search .......... 330/252–261; 455/118, 323; 327/361
See application file for complete search history.

(56) References Cited

U.S. PATENT DOCUMENTS

| 7,356,317 B2 | 4/2008 | Xu et al. |
| 7,659,784 B2 * | 2/2010 | Jang et al. ............ 331/40 |
| 2006/0014509 A1 | 1/2006 | Xu et al. |

FOREIGN PATENT DOCUMENTS

| CN | 1744428 | 3/2006 |
| CN | 101207592 | 6/2008 |
| JP | 59-178003 | 10/1984 |
| JP | 2000-323934 | 11/2000 |
| JP | 2002-057530 | 2/2002 |
| JP | 2005-130381 | 5/2005 |
| JP | 2006-033840 | 2/2006 |
| JP | 2007-514392 | 5/2007 |
| WO | 2006/085116 A1 | 8/2006 |
| WO | 2007/109502 A2 | 9/2007 |

OTHER PUBLICATIONS

Japanese Office Action for Japanese Patent Application No. 2008-131837 mailed on Jul. 19, 2011.
Chinese Office Action corresponding to U.S. Appl. No. 12/404,516 mailed on Jun. 22, 2011.
Bakkaloglu et al, A 1.5-V Multi-Mode Quad-Band RF Receiver for GSM/EDGE/CDMA2K in 90-nm Digital CMOS Process, IEEE Journal of Solid-State Circuits, vol. 41, No. 5, May 2006.
Yanduru et al, A WCDMA, GSM/GPRS/EDGE Receiver Front End without Interstage SAW Filter, Proceedings of RFIC Symposium, IEEE, Jun. 2006.
Tenbroek et al, Single-Chip, Tri-Band WCDMA/HSDPA Transreceiver without External SAW and with Integrated TX Power Control, ISSCC 2008, Session 10, Digest of Technical Papers, Feb. 2008.

* cited by examiner

*Primary Examiner* — Hieu Nguyen
(74) *Attorney, Agent, or Firm* — Turocy & Watson, LLP

(57) ABSTRACT

A filter circuit is constructed of a passive mixer and a frequency response device. The passive mixer generates a frequency-converted signal by mixing an input signal transmitted through a transmission line and a local oscillation signal, and outputs the frequency-converted signal to the frequency response device, thus shifting a frequency characteristic of the frequency response device to high frequency by a local oscillation frequency of the local oscillation signal and applying the frequency characteristic shifted to high frequency on the input signal.

15 Claims, 12 Drawing Sheets

FILTER CIRCUIT, WIRELESS TRANSMITTER, AND WIRELESS RECEIVER

CROSS-REFERENCE TO RELATED APPLICATIONS

This application is based upon and claims the benefit of priority from the prior Japanese Patent Application No. 2008-131837, filed on May 20, 2008; the entire contents of which are incorporated herein by reference.

BACKGROUND OF THE INVENTION

1. Field of the Invention

The present invention relates to a filter circuit, a wireless transmitter, and a wireless receiver, and more particularly, to a filter circuit including a passive mixer.

2. Description of the Related Art

Generally, a wireless communication apparatus is equipped with a filter circuit for selecting a signal of a specific frequency (see, for example, Japanese Patent Application Laid-open No. 2005-130381). Such a filter circuit is built by connecting a parallel circuit constructed of an inductor and a capacitor to a transmission line. The resonant frequency f of the filter circuit is given by $f=1/(2\pi(LC)^{1/2})$, where L [Henry] is the inductance of the inductor and C [Farad] is the capacitance of the capacitor.

If a frequency of a signal passing the transmission line is close to the resonant frequency, the impedance of the filter circuit becomes close to infinity, and as the frequency of the signal passing the transmission line goes apart from the resonant frequency, the impedance of the filter circuit decreases. Therefore, the filter circuit does not attenuate a signal having a frequency close to the resonant frequency, while attenuating a signal having a frequency apart from the resonant frequency, which makes it possible to select the signal having the frequency close to the resonant frequency.

When a variable inductor or a variable capacitor is used in the filter circuit, the resonant frequency can be changed by changing the inductance L or the capacitance, so that the signal attenuation band can be changed.

However, in a conventional filter circuit, because it becomes susceptible to an influence of the parasitic capacitance or the parasitic inductance as the resonant frequency (i.e., the filter center frequency) increases, it is hard to precisely match the resonant frequency to a target value by an electronic control, and it is hard to obtain a steep attenuation characteristic or a large attenuation amount.

Particularly when making the attenuation characteristic steep or increasing the attenuation amount, it is indispensible to precisely match the resonant frequency. However, with a frequency near 2 gigahertz, for example, it is hard to precisely match the resonant frequency on the order of 100 kilohertz.

BRIEF SUMMARY OF THE INVENTION

A filter circuit according to an embodiment of the present invention comprises: a frequency response device having a frequency characteristic; and a passive mixer that mixes an input signal and a local oscillation signal, and outputs a mixed signal to the frequency response device, thereby shifting the frequency characteristic of the frequency response device to high frequency by a local oscillation frequency of the local oscillation signal and applying the frequency characteristic shifted to high frequency on the input signal.

A radio transmitter according to an embodiment of the present invention comprises: an up-converter that converts a baseband signal or an intermediate-frequency signal into a radio-frequency signal; a frequency response device having a frequency characteristic; a passive mixer that mixes the radio-frequency signal and a local oscillation signal, and outputs a mixed signal to the frequency response device, thereby shifting the frequency characteristic of the frequency response device to high frequency by a local oscillation frequency of the local oscillation signal and applying the frequency characteristic shifted to high frequency on the radio-frequency signal; and a transmission antenna that transmits the radio-frequency signal on which the frequency characteristic of the frequency response device shifted to high frequency is applied to a space.

A radio receiver according to an embodiment of the present invention comprises: a reception antenna that receives a radio-frequency signal propagating in a space; a frequency response device having a frequency characteristic; a passive mixer that mixes the radio-frequency signal and a local oscillation signal, and outputs a mixed signal to the frequency response device, thereby shifting the frequency characteristic of the frequency response device to high frequency by a local oscillation frequency of the local oscillation signal and applying the frequency characteristic shifted to high frequency on the radio-frequency signal; and a down-converter that converts the radio-frequency signal on which the frequency characteristic of the frequency response device shifted to high frequency is applied into a baseband signal or an intermediate-frequency signal.

DETAILED DESCRIPTION OF THE INVENTION

Exemplary embodiments of a filter circuit, a wireless transmitter, and a wireless receiver according to the present invention will be explained in detail below with reference to the accompanying drawings. The present invention is not limited to the following embodiments.

Figure 1:
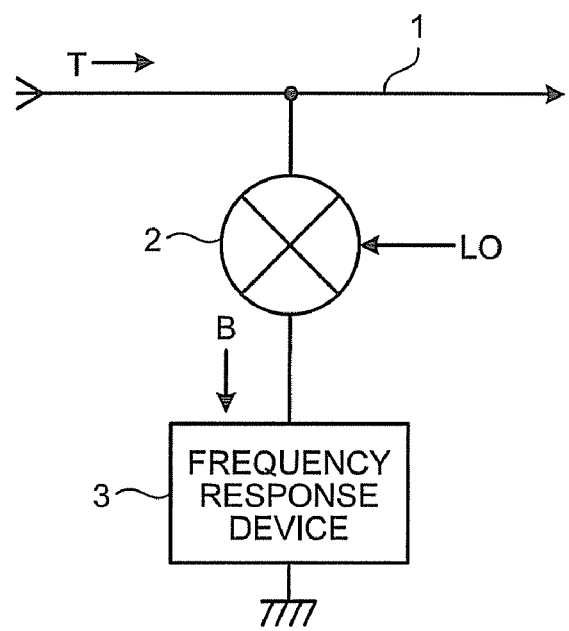
FIG. 1 is a block diagram of a filter circuit according to a first embodiment of the present invention.

FIG. 1 is a block diagram of a filter circuit according to a first embodiment of the present invention.

Figure 2:
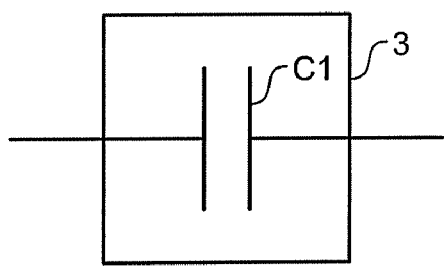
FIG. 2 is a circuit diagram illustrating an example of a frequency response device composed of a capacitor for the filter circuit according to the first embodiment.

As shown in FIG. 1, the filter circuit according to the first embodiment includes a passive mixer 2 and a frequency response device 3. The input terminal of the passive mixer 2 is connected to a transmission line 1, and the output terminal of the passive mixer 2 is grounded via the frequency response device 3. The frequency response device 3 can be constructed of a device having some sort of frequency response F. For example, the frequency response device 3 can be constructed of a capacitor C1 shown in FIG. 2, an inductor L1 shown in FIG. 3, a serial circuit constructed of a capacitor C2 and an inductor L2 shown in FIG. 4, and a parallel circuit constructed of a capacitor C3 and an inductor L3 shown in FIG. 5.

The passive mixer 2 can generate a frequency-converted signal B by mixing an input signal T that is transmitted through the transmission line 1 and a local oscillation signal LO. In doing so, the passive mixer 2 can apply the frequency characteristic F of the frequency response device 3, which is shifted to high frequency by a local oscillation frequency $f_{LO}$ of the local oscillation signal LO, on the input signal T by outputting the frequency-converted signal B to the frequency response device 3. The passive mixer 2 is a mixer that does not have an amplification function, and can be constructed of, for example, a mechanical switch or the like, such as a relay switch, or a transistor or the like that performs an on/off switching operation. In the case of using a transistor for the passive mixer 2, the transistor can be used as a variable resistor, and therefore, the input signal T can be applied to the source or the drain without being applied to the gate.

In other words, by mixing the input signal T and the local oscillation signal LO at the passive mixer 2, the frequency-converted signal B having frequencies of $f_{BB1}=|f_{RF}-f_{LO}|$ and $f_{BB2}=|f_{RF}+f_{LO}|$ is generated, where $f_{RF}$ is the frequency of the input signal T that is transmitted through the transmission line 1, and the frequency-converted signal B is output to the frequency response device 3. When the frequency-converted signal B is input to the frequency response device 3, the frequency characteristic F of the frequency response device 3 is applied on the frequency-converted signal B.

Considering the frequency $f_{BB1}$, when the frequency characteristic F of the frequency response device 3 is applied on the frequency-converted signal B, it means that a frequency characteristic F', which is the frequency characteristic F shifted to high frequency by the local oscillation frequency $f_{LO}$, is applied on the input signal T.

Therefore, for the input signal T, the passive mixer 2 and the frequency response device 3 can operate as a filter circuit that has the frequency characteristic F' which is the frequency characteristic F shifted to high frequency by the local oscillation frequency $f_{LO}$. Furthermore, the center frequency of this filter circuit can be easily changed by adjusting the local oscillation frequency $f_{LO}$ of the local oscillation signal LO.

The local oscillation frequency $f_{LO}$ of the local oscillation signal LO can be precisely adjusted on the order of 100 kilohertz even at a high frequency near 2 gigahertz by using a phase-locked loop (PLL) circuit, a delay-locked loop (DLL) circuit, or the like. As a result, even when the frequency of the input signal T is high, the filter center frequency for the input signal T can be adjusted using the frequency response device 3 that has a low filter frequency, which makes it possible to precisely adjust the center frequency of the filter circuit, and to make the attenuation characteristic steep and increase the attenuation amount for the input signal T.

Figure 6:
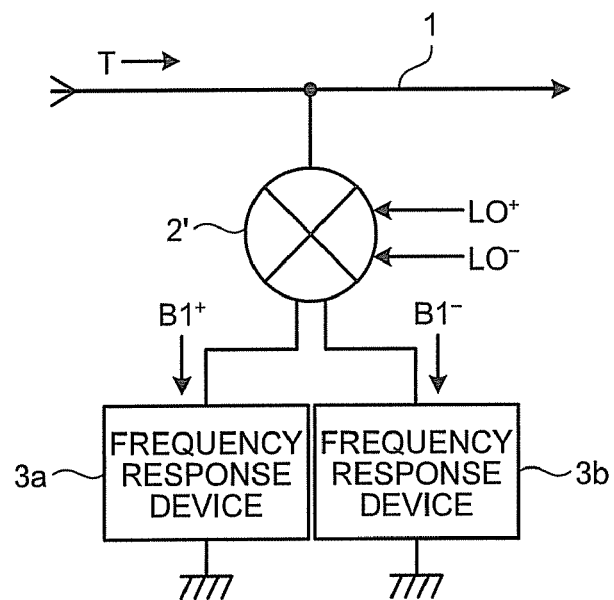
FIG. 6 is a block diagram of a filter circuit according to a second embodiment of the present invention.

FIG. 6 is a block diagram of a filter circuit according to a second embodiment of the present invention.

As shown in FIG. 6, the filter circuit according to the second embodiment includes a passive mixer 2' and frequency response devices 3a and 3b. The input terminal of the passive mixer 2' is connected to a transmission line 1, and the output terminal of the passive mixer 2' is grounded via the frequency response devices 3a and 3b. Each of the frequency response devices 3a and 3b can be constructed of a device having some sort of frequency response F. For example, each of the frequency response devices 3a and 3b can be constructed of the capacitor C1 shown in FIG. 2, the inductor L1 shown in FIG. 3, the serial circuit constructed of the capacitor C2 and the inductor L2 shown in FIG. 4, and the parallel circuit constructed of the capacitor C3 and the inductor L3 shown in FIG. 5.

The passive mixer 2' can generate frequency-converted signals $B1^+$ and $B1^-$ by mixing an input signal T that is transmitted through the transmission line 1 and local oscillation signals $LO^+$ and $LO^-$. As for the local oscillation signals $LO^+$ and $LO^-$, signals having the same frequency with opposite phases can be used. The passive mixer 2' can shift the frequency characteristic F of the frequency response devices 3a and 3b to high frequency by a local oscillation frequency $f_{LO}$ of the local oscillation signals LO$^+$ and LO$^-$ by outputting the frequency-converted signals B1$^+$ and B1$^-$ to the frequency response devices 3a and 3b, respectively, and thus applying the frequency characteristic F that is shifted to high frequency on the input signal T.

In other words, by applying the frequency characteristic F of the frequency response devices 3a and 3b on the frequency-converted signals B1$^+$ and B1$^-$, respectively, it is possible to apply a frequency characteristic F' which is the frequency characteristic F shifted to high frequency by the local oscillation frequency $f_{LO}$, on the input signal T.

Therefore, for the input signal T, the passive mixer 2' and the frequency response devices 3a and 3b can operate as a filter circuit that has the frequency characteristic F' which is the frequency characteristic F shifted to high frequency by the local oscillation frequency $f_{LO}$. As a result, even when the frequency of the input signal T is high, the center frequency of the filter circuit can be precisely matched to a target value, and at the same time, it is possible to make the attenuation characteristic steep and increase the attenuation amount for the input signal T.

Figure 7:
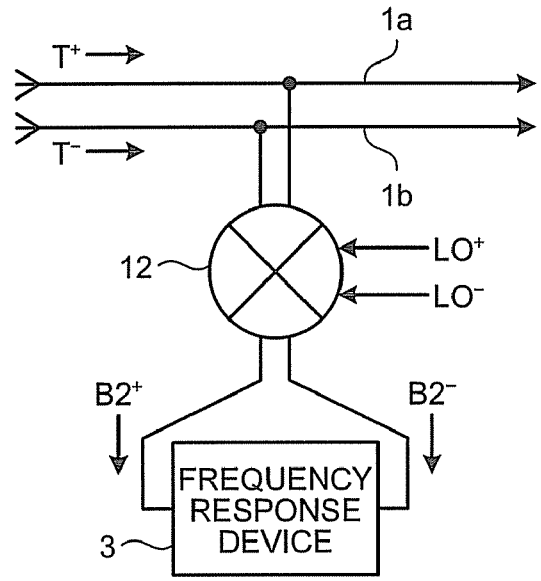
FIG. 7 is a block diagram of a filter circuit according to a third embodiment of the present invention.

FIG. 7 is a block diagram of a filter circuit according to a third embodiment of the present invention.

As shown in FIG. 7, the filter circuit according to the third embodiment includes a passive mixer 12 and a frequency response device 3. As for the passive mixer 12, a differential passive mixer can be used, in which a pair of input terminals for inputting differentials signal, a pair of control terminals for inputting local oscillation signals LO$^+$ and LO$^-$, and a pair of output terminals for outputting frequency-converted signals can be provided.

The input terminals of the passive mixer 12 are connected to transmission lines 1a and 1b, respectively, and the output terminals of the passive mixer 12 are connected to each other via the frequency response device 3.

The passive mixer 12 can generate frequency-converted signals B2$^+$ and B2$^-$ by mixing input signals T$^+$ and T$^-$ that are transmitted through the transmission lines 1a and 1b and the local oscillation signals LO$^+$ and LO$^-$, respectively. The transmission lines 1a and 1b can build a differential transmission line, and as for the input signals T$^+$ and T$^-$, a differential signal can be used. The passive mixer 12 can shift a frequency characteristic F of the frequency response device 3 to high frequency by a local oscillation frequency $f_{LO}$ of the local oscillation signals LO$^+$ and LO$^-$ by outputting the frequency-converted signals B2$^+$ and B2$^-$ to both terminals of the frequency response device 3, respectively, and apply the frequency characteristic F that is shifted to high frequency on the input signals T$^+$ and T$^-$.

In other words, by applying the frequency characteristic F of the frequency response device 3 on the frequency-converted signals B2$^+$ and B2$^-$, it is possible to apply a frequency characteristic F' which is the frequency characteristic F shifted to high frequency by the local oscillation frequency $f_{LO}$, on the input signals T$^+$ and T$^-$.

Therefore, for the input signals T$^+$ and T$^-$, the passive mixer 12 and the frequency response device 3 can operate as a filter circuit that has the frequency characteristic F' which is the frequency characteristic F shifted to high frequency by the local oscillation frequency $f_{LO}$. As a result, even when a high-frequency differential signal is input as the input signals T$^+$ and T$^-$, the center frequency of the filter circuit can be precisely matched to a target value, and at the same time, it is possible to make the attenuation characteristic steep and increase the attenuation amount for the input signals T$^+$ and T$^-$, and to increase the signal transmission speed while decreasing the common-mode noise.

Figure 3:
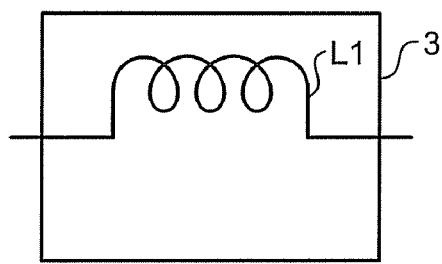
FIG. 3 is a circuit diagram illustrating another example of the frequency response device composed of an inductor for the filter circuit according to the first embodiment.
Figure 8:
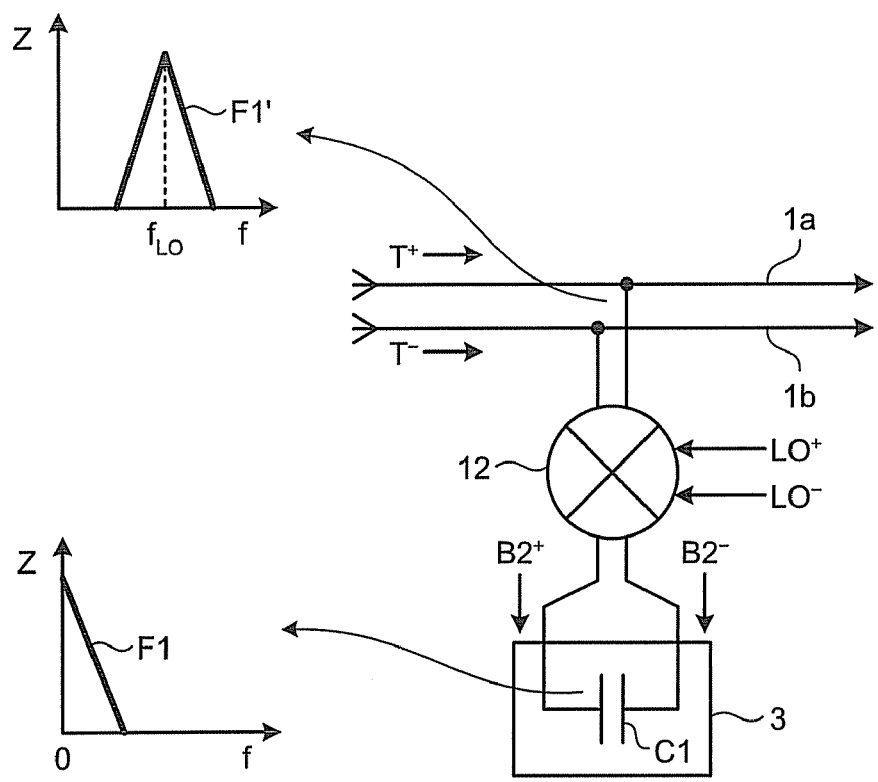
FIG. 8 is a block diagram of a filter circuit according to a fourth embodiment of the present invention.

FIG. 8 is a block diagram of a filter circuit according to a fourth embodiment of the present invention with a configuration that the frequency response device shown in FIG. 3 is applied to the filter circuit shown in FIG. 7.

As shown in FIG. 8, the capacitor C1 is used as the frequency response device 3 of the filter circuit shown in FIG. 7. A frequency characteristic F1 of the capacitor C1 is that the impedance Z increase as the frequency f decreases and the impedance Z becomes infinity at the frequency zero (direct current). The impedance Z decreases as the frequency f increase. Therefore, when the frequency $f_{BB1}$ of the frequency-converted signals B2$^+$ and B2$^-$ is low, less current flows in the capacitor C1, and on the other hand, when the frequency $f_{BB1}$ of the frequency-converted signals B2$^+$ and B2$^-$ is high, more current flows in the capacitor C1.

When the input terminals of the passive mixer 12 are connected to the transmission lines 1a and 1b, respectively, the impedance characteristic of the output terminals of the passive mixer 12 can be observed from the transmission lines 1a and 1b side, too. In the case in which more current flows at the output terminals of the passive mixer 12 (i.e., when the frequency $f_{RF}$ of the input signals T$^+$ and T$^-$ is apart from the local oscillation frequency $f_{LO}$), more current flows at the transmission lines 1a and 1b side, too. On the other hand, in the case in which less current flows at the output terminals of the passive mixer 12 (i.e., when the frequency $f_{RF}$ of the input signals T$^+$ and T$^-$ is close to the local oscillation frequency $f_{LO}$), less current flows at the transmission lines 1a and 1b side, too.

From the above aspect, when the frequency $f_{RF}$ of the input signals T$^+$ and T$^-$ is apart from the local oscillation frequency $f_{LO}$, the current is easily flown to the passive mixer 12 from the transmission lines 1a and 1b, and when the frequency $f_{RF}$ of the input signals T$^+$ and T$^-$ is close to the local oscillation frequency $f_{LO}$, the current is hardly flown to the passive mixer 12 from the transmission lines 1a and 1b. As a result, the frequency characteristic F1 of the capacitor C1, which is symmetrically folded at the local oscillation frequency $f_{LO}$ as the center, is up-converted to the transmission lines 1a and 1b side by the local oscillation frequency $f_{LO}$, and it is possible to make a band-pass characteristic F1' with the center at the local oscillation frequency $f_{LO}$ appear on the transmission lines 1a and 1b side.

Considering the frequency $f_{BB2}$ of the frequency-converted signals B2$^+$ and B2$^-$, both when the frequency $f_{RF}$ of the input signals T$^+$ and T$^-$ is apart from the local oscillation frequency $f_{LO}$ and when the frequency $f_{RF}$ of the input signals T$^+$ and T$^-$ is close to the local oscillation frequency $f_{LO}$, the frequency $f_{BB2}$ of the frequency-converted signals B2$^+$ and B2$^-$ becomes high, and the impedance Z of the capacitor C1 is decreased.

For this reason, for the frequency $f_{BB2}$, a large change does not occur in the impedance Z on the frequency characteristic F1 of the capacitor C1, and for the frequency $f_{BB1}$, a large change occurs in the impedance Z on the frequency characteristic F1 of the capacitor C1. Therefore, when the total impedance characteristic of the output terminals of the passive mixer 12 is observed from the transmission lines 1a and 1b side, the change of the impedance Z can be ignored on the frequency characteristic F1 in the frequency $f_{BB2}$, and only the change of the impedance Z on the frequency characteristic F1 in the frequency $f_{BB1}$ can be dominantly observed as the total change of the impedance Z.

As a result, by using the capacitor C1 as the frequency response device 3 of the filter circuit shown in FIG. 7, it is possible to obtain the band-pass characteristic F1' with the local oscillation frequency $f_{LO}$ as the center with respect to transmission lines 1a and 1b. Because the local oscillation frequency $f_{LO}$ can be freely varied, the center frequency of the pass band can be also changed freely and precisely. Furthermore, because the Q factor of the capacitor C1 can be easily increased, a band-pass filter having an extremely narrow bandwidth can be constructed. In addition, because the passive mixer 12 can be easily formed by a semiconductor manufacturing process, it can be constructed on the same integrated circuit (IC) chip with the other circuits, which leads to a cost down without using an external filter device. Moreover, since it does not consume the electric power because it is a passive mixer, the filter function can be added without increasing the power consumption. As a result, by using the passive mixer 12 and the capacitor C1, it is possible to realize a high-performance tunable band-pass filter with ease.

Figure 4:
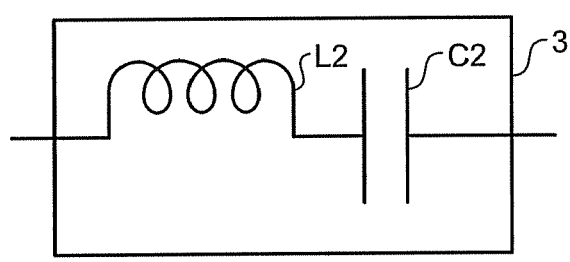
FIG. 4 is a circuit diagram illustrating still another example of the frequency response device composed of a capacitor and an inductor connected in series for the filter circuit according to the first embodiment.
Figure 9:
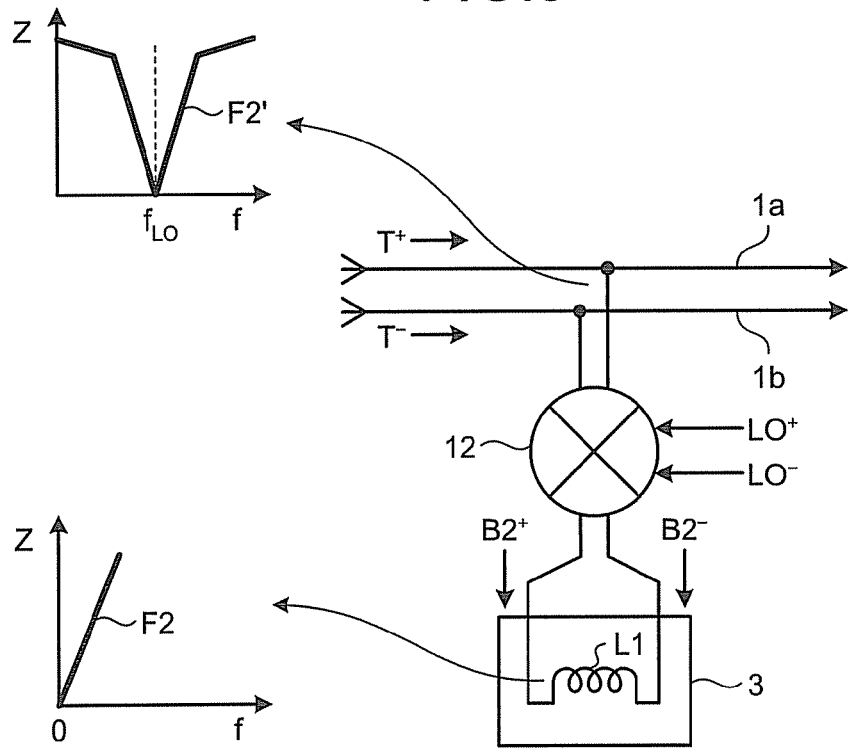
FIG. 9 is a block diagram of a filter circuit according to a fifth embodiment of the present invention.

FIG. 9 is a block diagram of a filter circuit according to a fifth embodiment of the present invention with a configuration that the frequency response device shown in FIG. 4 is applied to the filter circuit shown in FIG. 7.

As shown in FIG. 9, the inductor L1 is used as the frequency response device 3 of the filter circuit shown in FIG. 7. The frequency characteristic F2 of the inductor L1 is that the impedance Z decrease as the frequency f decreases and the impedance Z becomes zero at the frequency zero (direct current). The impedance Z increase as the frequency f increases. Therefore, when the frequency $f_{BB1}$ of the frequency-converted signals B2$^+$ and B2$^-$ is low, more current flows in the inductor L1, and on the other hand, when the frequency $f_{BB1}$ of the frequency-converted signals B2$^+$ and B2$^-$ is high, less current flows in the inductor L1.

When the input terminals of the passive mixer 12 are connected to the transmission lines 1a and 1b, respectively, the impedance characteristic of the output terminals of the passive mixer 12 can be observed from the transmission lines 1a and 1b side, too. In the case in which more current flows at the output terminals of the passive mixer 12 (i.e., when the frequency $f_{RF}$ of the input signals T$^+$ and T$^-$ is close to the local oscillation frequency $f_{LO}$), more current flows at the transmission lines 1a and 1b side, too. On the other hand, in the case in which less current flows at the output terminals of the passive mixer 12 (i.e., when the frequency $f_{RF}$ of the input signals T$^+$ and T is apart from the local oscillation frequency $f_{LO}$), less current flows at the transmission lines 1a and 1b side, too.

From the above aspect, when the frequency $f_{RF}$ of the input signals T$^+$ and T$^-$ is close to the local oscillation frequency $f_{LO}$, the current is easily flown to the passive mixer 12 from the transmission lines 1a and 1b, and when the frequency $f_{RF}$ of the input signals T$^+$ and T$^-$ is apart from the local oscillation frequency $f_{LO}$, the current is hardly flown to the passive mixer 12 from the transmission lines 1a and 1b. As a result, the frequency characteristic F2 of the inductor L1, which is symmetrically folded at the local oscillation frequency $f_{LO}$ as the center, is up-converted to the transmission lines 1a and 1b side by the local oscillation frequency $f_{LO}$, and it is possible to make a band-stop characteristic F2' with the center at the local oscillation frequency $f_{LO}$ appear on the transmission lines 1a and 1b side.

Considering the frequency $f_{BB2}$ of the frequency-converted signals B2$^+$ and B2$^-$, both when the frequency $f_{RF}$ of the input signals T$^+$ and T is apart from the local oscillation frequency $f_{LO}$ and when the frequency $f_{RF}$ of the input signals T$^+$ and T$^-$ is close to the local oscillation frequency $f_{LO}$, the frequency $f_{BB2}$ of the frequency-converted signals B2$^+$ and B2$^-$ becomes high, and the impedance Z of the inductor L1 is increased.

For this reason, for the frequency $f_{BB2}$, a large change does not occur in the impedance Z on the frequency characteristic F2 of the inductor L1, and for the frequency $f_{BB1}$, a large change occurs in the impedance Z on the frequency characteristic F2 of the inductor L1. Therefore, when the total impedance characteristic of the output terminals of the passive mixer 12 is observed from the transmission lines 1a and 1b side, the change of the impedance Z can be ignored on the frequency characteristic F2 in the frequency $f_{BB2}$, and only the change of the impedance Z on the frequency characteristic F2 in the frequency $f_{BB1}$ can be dominantly observed as the total change of the impedance Z.

As a result, by using the inductor L1 as the frequency response device 3 of the filter circuit shown in FIG. 7, it is possible to obtain the band-stop characteristic F2' with the local oscillation frequency $f_{LO}$ as the center with respect to transmission lines 1a and 1b. Because the local oscillation frequency $f_{LO}$ can be freely varied, the center frequency of the pass band can be also changed freely and precisely. Furthermore, because the Q factor of the inductor L1 can be easily increased, a band-stop filter having an extremely narrow bandwidth can be constructed. In addition, because the passive mixer 12 can be easily formed by a semiconductor manufacturing process, it can be constructed on the same integrated circuit (IC) chip with the other circuits, which leads to a cost down without using an external filter device. Moreover, since it does not consume the electric power because it is a passive mixer, the filter function can be added without increasing the power consumption. As a result, by using the passive mixer 12 and the inductor L1, it is possible to realize a high-performance tunable band-stop filter with ease.

Figure 5:
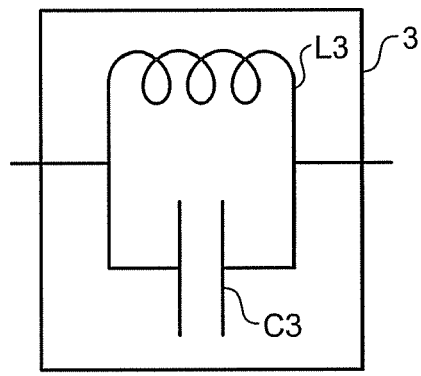
FIG. 5 is a circuit diagram illustrating still another example of the frequency response device composed of a capacitor and an inductor connected in parallel for the filter circuit according to the first embodiment.
Figure 10:
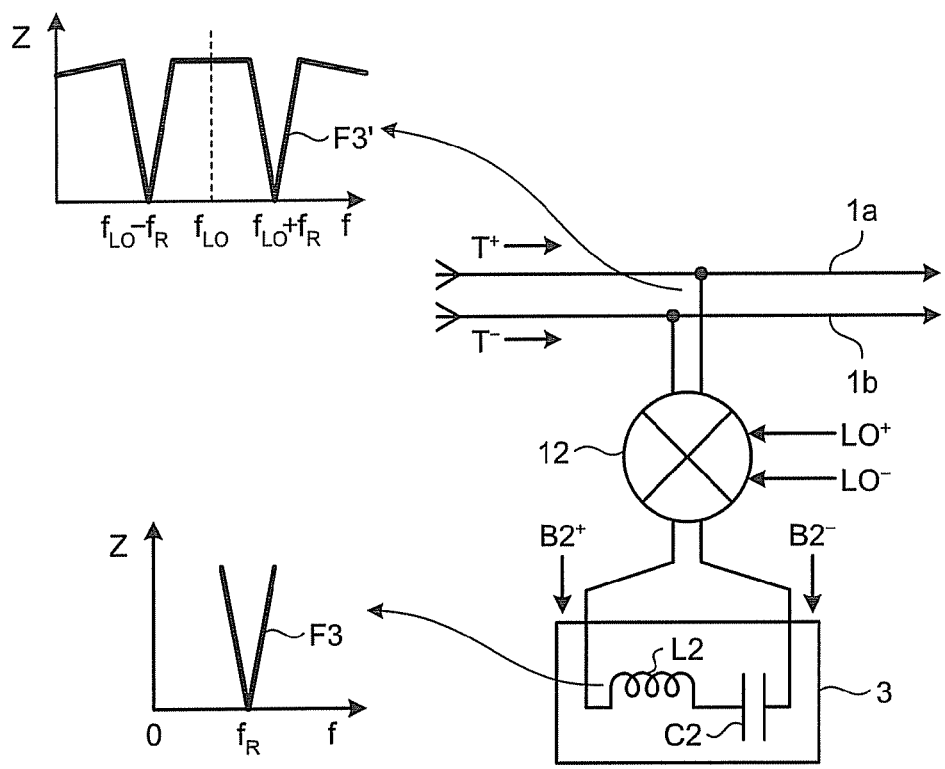
FIG. 10 is a block diagram of a filter circuit according to a sixth embodiment of the present invention.

FIG. 10 is a block diagram of a filter circuit according to a sixth embodiment of the present invention with a configuration that the frequency response device shown in FIG. 5 is applied to the filter circuit shown in FIG. 7.

As shown in FIG. 10, the serial circuit of the inductor L2 and the capacitor C2 is used as the frequency response device 3 of the filter circuit shown in FIG. 7. The resonant frequency of the serial circuit of the inductor L2 and the capacitor C2 is $f_R$, and it is assumed that the resonant frequency $f_R$ is lower enough than the local oscillation frequency $f_{LO}$. A frequency characteristic F3 of the serial circuit of the inductor L2 and the capacitor C2 is that the impedance Z becomes low near the resonant frequency $f_R$, and the impedance Z increase as the frequency is apart from resonant frequency $f_R$. Therefore, when the frequency $f_{BB1}$ of the frequency-converted signals B2$^+$ and B2$^-$ is near the resonant frequency $f_R$, more current flows in the serial circuit of the inductor L2 and the capacitor C2, and on the other hand, when the frequency $f_{BB1}$ of the frequency-converted signals B2$^+$ and B2$^-$ is apart from the resonant frequency $f_R$, less current flows in the serial circuit of the inductor L2 and the capacitor C2.

When the input terminals of the passive mixer 12 are connected to the transmission lines 1a and 1b, respectively, the impedance characteristic of the output terminals of the passive mixer 12 can be observed from the transmission lines 1a and 1b side, too. In the case in which more current flows at the output terminals of the passive mixer 12 (i.e., when the frequency $f_{RF}$ of the input signals T$^+$ and T$^-$ is close to $f_{LO} \pm f_R$), more current flows at the transmission lines 1a and 1b side, too. On the other hand, in the case in which less current flows at the output terminals of the passive mixer 12 (i.e., when the frequency $f_{RF}$ of the input signals T$^+$ and T$^-$ is apart from $f_{LO}\pm f_R$), less current flows at the transmission lines 1a and 1b side, too.

From the above aspect, when the frequency $f_{RF}$ of the input signals T$^+$ and T$^-$ is close to $f_{LO}\pm f_R$, the current is easily flown to the passive mixer 12 from the transmission lines 1a and 1b, and when the frequency $f_{RF}$ of the input signals T$^+$ and T$^-$ is apart from $f_{LO}\pm f_R$, the current is hardly flown to the passive mixer 12 from the transmission lines 1a and 1b. As a result, the frequency characteristic F3 of the serial circuit of the inductor L2 and the capacitor C2, which is symmetrically folded at the local oscillation frequency $f_{LO}$ as the center, is up-converted to the transmission lines 1a and 1b side by the local oscillation frequency $f_{LO}$, and it is possible to make a two-band band-stop characteristic F3' with the center at the local oscillation frequency $f_{LO}$ appear on the transmission lines 1a and 1b side.

Considering the frequency $f_{BB2}$ of the frequency-converted signals B2$^+$ and B2$^-$, both when the frequency $f_{RF}$ of the input signals T$^+$ and T$^-$ is apart from $f_{LO}\pm f_R$ and when the frequency $f_{RF}$ of the input signals T$^+$ and T$^-$ is close to $f_{LO}\pm f_R$, the frequency $f_{BB2}$ of the frequency-converted signals B2$^+$ and B2$^-$ becomes high, and the impedance Z of the serial circuit of the inductor L2 and the capacitor C2 is increased.

For this reason, for the frequency $f_{BB2}$, a large change does not occur in the impedance Z on the frequency characteristic F3 of the serial circuit of the inductor L2 and the capacitor C2, and for the frequency $f_{BB1}$, a large change occurs in the impedance Z on the frequency characteristic F3 of the serial circuit of the inductor L2 and the capacitor C2. Therefore, when the total impedance characteristic of the output terminals of the passive mixer 12 is observed from the transmission lines 1a and 1b side, the change of the impedance Z can be ignored on the frequency characteristic F3 in the frequency $f_{BB2}$, and only the change of the impedance Z on the frequency characteristic F3 in the frequency $f_{BB1}$ can be dominantly observed as the total change of the impedance Z.

As a result, by using the serial circuit of the inductor L2 and the capacitor C2 as the frequency response device 3 of the filter circuit shown in FIG. 7, it is possible to obtain the band-stop characteristic F3' with $f_{LO}\pm f_R$ as the center with respect to transmission lines 1a and 1b. Because the local oscillation frequency $f_{LO}$ can be freely varied, the center frequency of the pass band can be also changed freely and precisely. Furthermore, because the Q factors of the inductor L2 and the capacitor C2 can be easily increased, a band-stop filter having an extremely narrow bandwidth can be constructed. In addition, because the passive mixer 12 can be easily formed by a semiconductor manufacturing process, it can be constructed on the same integrated circuit (IC) chip with the other circuits, which leads to a cost down without using an external filter device. Moreover, since it does not consume the electric power because it is a passive mixer, the filter function can be added without increasing the power consumption. As a result, by using the passive mixer 12 and the serial circuit of the inductor L2 and the capacitor C2, it is possible to realize a high-performance tunable band-stop filter with ease.

Figure 11:
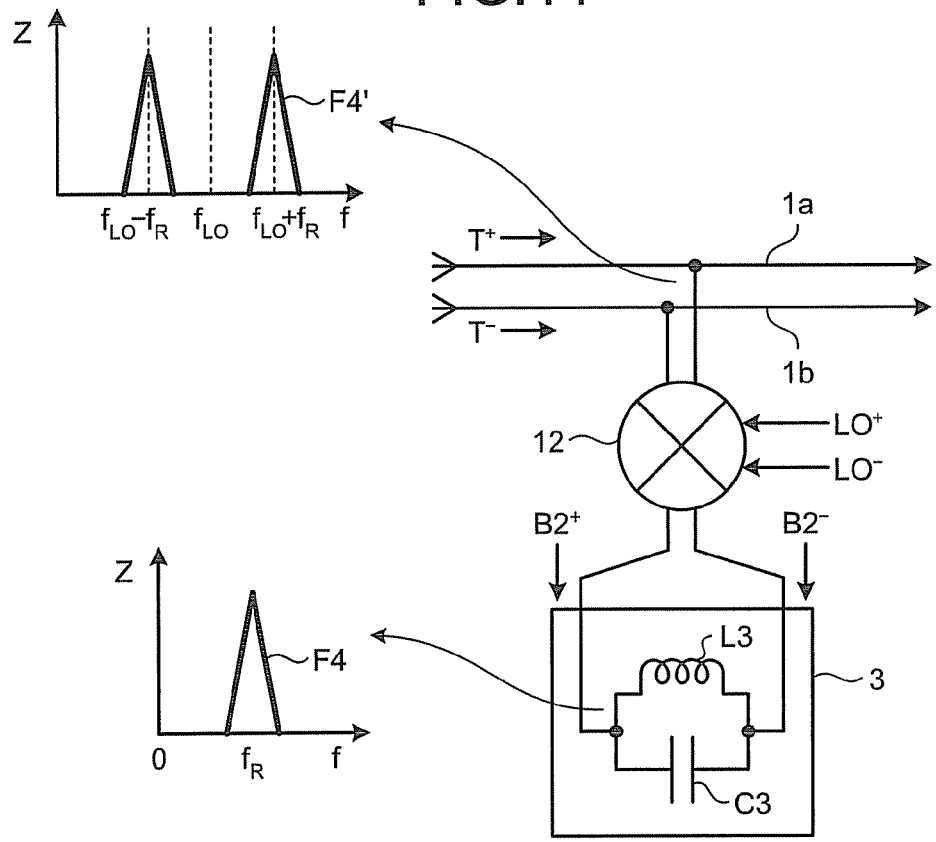
FIG. 11 is a block diagram of a filter circuit according to a seventh embodiment of the present invention.

FIG. 11 is a block diagram of a filter circuit according to a seventh embodiment of the present invention with a configuration that the frequency response device shown in FIG. 6 is applied to the filter circuit shown in FIG. 7.

As shown in FIG. 11, the parallel circuit of the inductor L3 and the capacitor C3 is used as the frequency response device 3 of the filter circuit shown in FIG. 7. The resonant frequency of the parallel circuit of the inductor L3 and the capacitor C3 is $f_R$, and it is assumed that the resonant frequency $f_R$ is lower enough than the local oscillation frequency $f_{LO}$. A frequency characteristic F4 of the parallel circuit of the inductor L3 and the capacitor C3 is that the impedance Z becomes high near the resonant frequency $f_R$, and the impedance Z decreases as the frequency is apart from resonant frequency $f_R$. Therefore, when the frequency $f_{BB1}$ of the frequency-converted signals B2$^+$ and B2$^-$ is apart from the resonant frequency $f_R$, more current flows in the parallel circuit of the inductor L3 and the capacitor C3, and on the other hand, when the frequency $f_{BB1}$ of the frequency-converted signals B2$^+$ and B2$^-$ is close to the resonant frequency $f_R$, less current flows in the parallel circuit of the inductor L3 and the capacitor C3.

When the input terminals of the passive mixer 12 are connected to the transmission lines 1a and 1b, respectively, the impedance characteristic of the output terminals of the passive mixer 12 can be observed from the transmission lines 1a and 1b side, too. In the case in which more current flows at the output terminals of the passive mixer 12 (i.e., when the frequency $f_{RF}$ of the input signals T$^+$ and T$^-$ is apart from $f_{LO}\pm f_R$), more current flows at the transmission lines 1a and 1b side, too. On the other hand, in the case in which less current flows at the output terminals of the passive mixer 12 (i.e., when the frequency $f_{RF}$ of the input signals T$^+$ and T$^-$ is close to $f_{LO}\pm f_R$), less current flows at the transmission lines 1a and 1b side, too.

From the above aspect, when the frequency $f_{RF}$ of the input signals T$^+$ and T$^-$ is apart from $f_{LO}\pm f_R$, the current is easily flown to the passive mixer 12 from the transmission lines 1a and 1b, and when the frequency $f_{RF}$ of the input signals T$^+$ and T$^-$ is close to $f_{LO}\pm f_R$, the current is hardly flown to the passive mixer 12 from the transmission lines 1a and 1b. As a result, the frequency characteristic F4 of the parallel circuit of the inductor L3 and the capacitor C3, which is symmetrically folded at the local oscillation frequency $f_{LO}$ as the center, is up-converted to the transmission lines 1a and 1b side by the local oscillation frequency $f_{LO}$, and it is possible to make a two-band band-pass characteristic F4' with the center at the local oscillation frequency $f_{LO}$ appear on the transmission lines 1a and 1b side.

Considering the frequency $f_{BB2}$ of the frequency-converted signals B2$^+$ and B2$^-$, both when the frequency $f_{RF}$ of the input signals T$^+$ and T$^-$ is apart from $f_{LO}\pm f_R$ and when the frequency $f_{RF}$ of the input signals T$^+$ and T$^-$ is close to $f_{LO}\pm f_R$, the frequency $f_{BB2}$ of the frequency-converted signals B2$^+$ and B2$^-$ becomes high, and the impedance Z of the parallel circuit of the inductor L3 and the capacitor C3 is decreased.

For this reason, for the frequency $f_{BB2}$, a large change does not occur in the impedance Z on the frequency characteristic F4 of the parallel circuit of the inductor L3 and the capacitor C3, and for the frequency $f_{BB1}$, a large change occurs in the impedance Z on the frequency characteristic F4 of the parallel circuit of the inductor L3 and the capacitor C3. Therefore, when the total impedance characteristic of the output terminals of the passive mixer 12 is observed from the transmission lines 1a and 1b side, the change of the impedance Z can be ignored on the frequency characteristic F4 in the frequency $f_{BB2}$, and only the change of the impedance Z on the frequency characteristic F4 in the frequency $f_{BB1}$ can be dominantly observed as the total change of the impedance Z.

As a result, by using the parallel circuit of the inductor L3 and the capacitor C3 as the frequency response device 3 of the filter circuit shown in FIG. 7, it is possible to obtain the band-pass characteristic F4' with $f_{LO}\pm f_R$ as the center with respect to transmission lines 1a and 1b. Because the local oscillation frequency $f_{LO}$ can be freely varied, the center frequency of the pass band can be also changed freely and precisely. Furthermore, because the Q factors of the inductor L3 and the capacitor C3 can be easily increased, a band-pass filter having an extremely narrow bandwidth can be constructed. In addition, because the passive mixer 12 can be easily formed by a semiconductor manufacturing process, it can be constructed on the same integrated circuit (IC) chip with the other circuits, which leads to a cost down without using an external filter device. Moreover, since it does not consume the electric power because it is a passive mixer, the filter function can be added without increasing the power consumption. As a result, by using the passive mixer 12 and the parallel circuit of the inductor L3 and the capacitor C3, it is possible to realize a high-performance tunable band-pass filter with ease.

Figure 12:
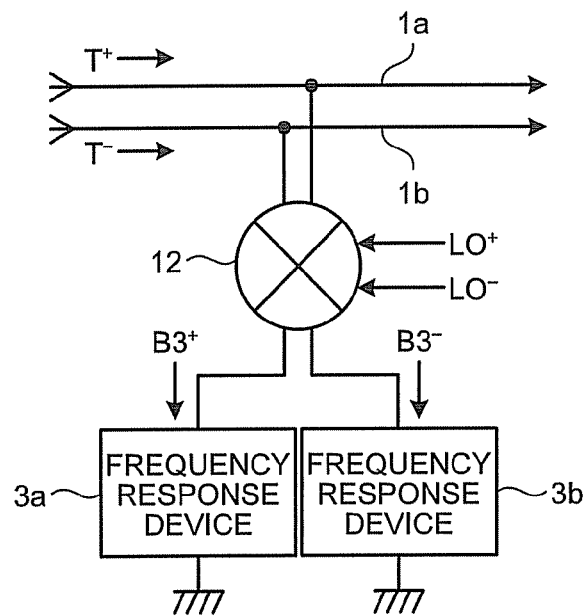
FIG. 12 is a block diagram of a filter circuit according to an eighth embodiment of the present invention.

FIG. 12 is a block diagram of a filter circuit according to an eighth embodiment of the present invention.

As shown in FIG. 12, the filter circuit according to the eighth embodiment includes a passive mixer 12 and frequency response devices 3a and 3b. The input terminals of the passive mixer 12 are connected to transmission lines 1a and 1b, respectively, and the output terminals of the passive mixer 12 are grounded via the frequency response devices 3a and 3b, respectively.

The passive mixer 12 can generate frequency-converted signals B3$^+$ and B3$^-$ by mixing input signals T$^+$ and T$^-$ that are transmitted through the transmission lines 1a and 1b and local oscillation signals LO$^+$ and LO$^-$, respectively. The passive mixer 12 can shift a frequency characteristic F of the frequency response devices 3a and 3b to high frequency by a local oscillation frequency $f_{LO}$ of the local oscillation signals LO$^+$ and LO$^-$ by outputting the frequency-converted signals B3$^+$ and B3$^-$ to the frequency response devices 3a and 3b, respectively, and apply the frequency characteristic F that is shifted to high frequency on the input signals T$^+$ and T$^-$.

In other words, by applying the frequency characteristic F of the frequency response devices 3a and 3b on the frequency-converted signals B3$^+$ and B3$^-$, respectively, it is possible to apply a frequency characteristic F' which is the frequency characteristic F shifted to high frequency by the local oscillation frequency $f_{LO}$, on the input signals T$^+$ and T$^-$.

Therefore, for the input signals T$^+$ and T$^-$, the passive mixer 12 and the frequency response devices 3a and 3b can operate as a filter circuit that has the frequency characteristic F' which is the frequency characteristic F shifted to high frequency by the local oscillation frequency $f_{LO}$. As a result, even when a high-frequency differential signal is input as the input signals T$^+$ and T$^-$, the center frequency of the filter circuit can be precisely matched to a target value, and at the same time, it is possible to make the attenuation characteristic steep and increase the attenuation amount for the input signals T$^+$ and T$^-$, and to increase the signal transmission speed while decreasing the common-mode noise.

Figure 13:
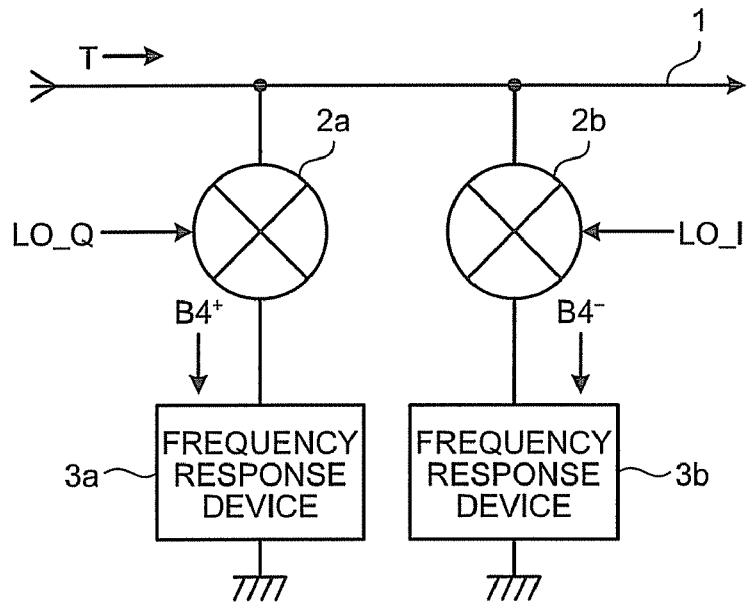
FIG. 13 is a block diagram of a filter circuit according to a ninth embodiment of the present invention.

FIG. 13 is a block diagram of a filter circuit according to a ninth embodiment of the present invention.

As shown in FIG. 13, the filter circuit according to the ninth embodiment includes passive mixers 2a and 2b and frequency response devices 3a and 3b. The input terminals of the passive mixers 2a and 2b are connected to a transmission line 1, and the output terminals of the passive mixers 2a and 2b are grounded via the frequency response devices 3a and 3b, respectively. The passive mixer 2a can be used for quadrature phase signals, and the passive mixer 2b can be used for an inphase signal.

The passive mixers 2a and 2b can generate frequency-converted signals B4$^+$ and B4$^-$ by mixing an input signal T that is transmitted through the transmission line 1 and local oscillation signals LO_Q and LO_I, respectively. As for the local oscillation signals LO_Q and LO_I, signals having the same frequency with phases shifted by 90 degrees can be used.

The passive mixers 2a and 2b can shift the frequency characteristic F of the frequency response devices 3a and 3b to high frequency by a local oscillation frequency $f_{LO}$ of the local oscillation signals LO_Q and LO_I by outputting the frequency-converted signals B4$^+$ and B4$^-$ to the frequency response devices 3a and 3b, respectively, and thus applying the frequency characteristic F that is shifted to high frequency on the input signal T. In other words, by applying the frequency characteristic F of the frequency response devices 3a and 3b on the frequency-converted signals B4$^+$ and B4$^-$, respectively, it is possible to apply a frequency characteristic F' which is the frequency characteristic F shifted to high frequency by the local oscillation frequency $f_{LO}$, on the input signal T.

Therefore, for the quadrature phase components and the inphase components of the input signal T, the passive mixers 2a and 2b and the frequency response devices 3a and 3b can operate as a filter circuit that has the frequency characteristic F' which is the frequency characteristic F shifted to high frequency by the local oscillation frequency $f_{LO}$. As a result, even when the frequency of the input signal T is high, the quadrature phase signals and the inphase signals used in a wireless communication apparatus can be handled, the center frequency of the filter circuit can be precisely matched to a target value, and at the same time, it is possible to make the attenuation characteristic steep and increase the attenuation amount for the input signal T.

In a wireless communication circuit, the local oscillation signal LO is less often used in a single signal, and two systems of local oscillation signals LO_Q and LO_I with the phases shifted by 90 degrees are used in most cases. Although it is possible to construct the filter circuit shown in FIG. 1, FIG. 6, FIG. 7, or FIG. 12 by extracting one side of the two systems, if only the one side of the two systems is extracted, the circuit structure becomes unbalanced, resulting in a failure in keeping 90 degrees of the phase difference between the local oscillation signals LO_Q and LO_I or an occurrence of a difference in the voltage amplitudes. Therefore, as shown in FIG. 13, an adverse effect on the other circuits can be prevented by taking the configuration of using both of the two systems of the local oscillation signals LO_Q and LO_I.

Figure 14:
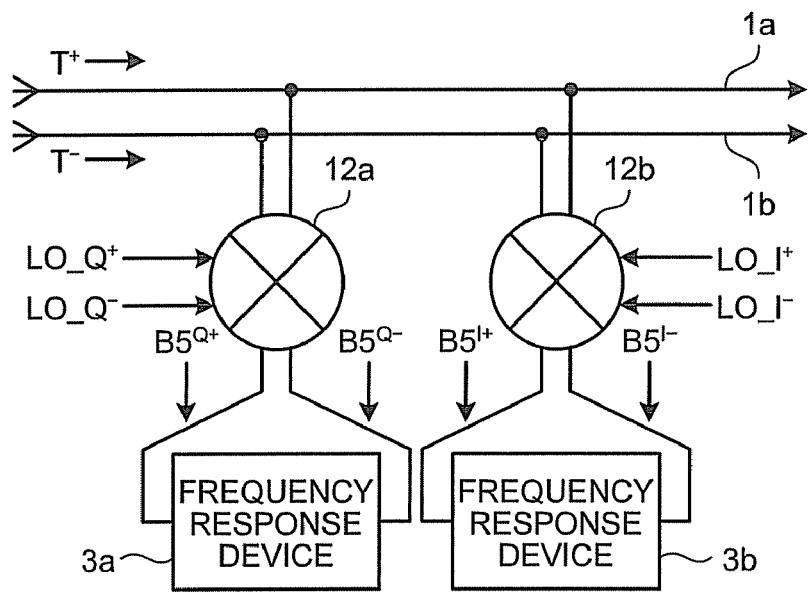
FIG. 14 is a block diagram of a filter circuit according to a tenth embodiment of the present invention.

FIG. 14 is a block diagram of a filter circuit according to a tenth embodiment of the present invention.

As shown in FIG. 14, the filter circuit according to the tenth embodiment includes passive mixers 12a and 12b and frequency response devices 3a and 3b. As for the passive mixers 12a and 12b, a differential passive mixer can be used. The passive mixer 12a can be used for quadrature phase signals, and the passive mixer 12b can be used for an inphase signal. The input terminals of the passive mixer 12a are connected to transmission lines 1a and 1b, respectively, and the output terminals of the passive mixer 12a are connected to each other via the frequency response device 3a. Similarly, the input terminals of the passive mixer 12b are connected to transmission lines 1a and 1b, respectively, and the output terminals of the passive mixer 12b are connected to each other via the frequency response device 3b.

The passive mixer 12a can generate frequency-converted signals B5$^{Q+}$ and B5$^{Q-}$ by mixing input signals T$^+$ and T$^-$ that are transmitted through the transmission lines 1a and 1b, respectively, and local oscillation signals LO_Q$^+$ and LO_Q$^-$, respectively. The passive mixer 12b can generate frequency-converted signals B5$^{Q+}$ and B5$^{Q-}$ by mixing input signals T$^+$ and T$^-$ that are transmitted through the transmission lines 1a and 1b, respectively, and local oscillation signals LO_I⁺ and LO_I⁻, respectively. As for the local oscillation signals LO_Q⁺, LO_Q⁻, LO_I⁺, and LO_I⁻, signals having the same frequency with phases sequentially shifted by 90 degrees can be used.

The passive mixer 12a can shift a frequency characteristic F of the frequency response device 3a to high frequency by a local oscillation frequency $f_{LO}$ of the local oscillation signals LO_Q⁺ and LO_Q⁻ by outputting the frequency-converted signals B5$^{Q+}$ and B5$^{Q-}$ to both terminals of the frequency response device 3a, respectively, and apply the frequency characteristic F that is shifted to high frequency on the input signals T⁺ and T⁻. The passive mixer 12b can shift a frequency characteristic F of the frequency response device 3b to high frequency by a local oscillation frequency $f_{LO}$ of the local oscillation signals LO_I⁺ and LO_I⁻ by outputting the frequency-converted signals B5$^{I+}$ and B5$^{I-}$ to both terminals of the frequency response device 3b, respectively, and apply the frequency characteristic F that is shifted to high frequency on the input signals T⁺ and T⁻.

In other words, by applying the frequency characteristic F of the frequency response device 3a on the frequency-converted signals B5$^{Q+}$ and B5$^{Q-}$, it is possible to apply a frequency characteristic F' which is the frequency characteristic F shifted to high frequency by the local oscillation frequency $f_{LO}$, on the quadrature phase components of the input signals T⁺ and T⁻. Similarly, by applying the frequency characteristic F of the frequency response device 3b on the frequency-converted signals B5$^{I+}$ and B5$^{I-}$, it is possible to apply a frequency characteristic F' which is the frequency characteristic F shifted to high frequency by the local oscillation frequency $f_{LO}$, on the inphase components of the input signals T⁺ and T⁻.

Therefore, for the quadrature phase components and the inphase components of the input signals T⁺ and T⁻, the passive mixers 12a and 12b and the frequency response devices 3a and 3b can operate as a filter circuit that has the frequency characteristic F' which is the frequency characteristic F shifted to high frequency by the local oscillation frequency $f_{LO}$. As a result, even when high-frequency differential signals are input as the quadrature phase components and the inphase components of the input signals T⁺ and T⁻, the center frequency of the filter circuit can be precisely matched to a target value, and at the same time, it is possible to make the attenuation characteristic steep and increase the attenuation amount for the input signals T⁺ and T⁻, and to increase the signal transmission speed while decreasing the common-mode noise.

Figure 15:
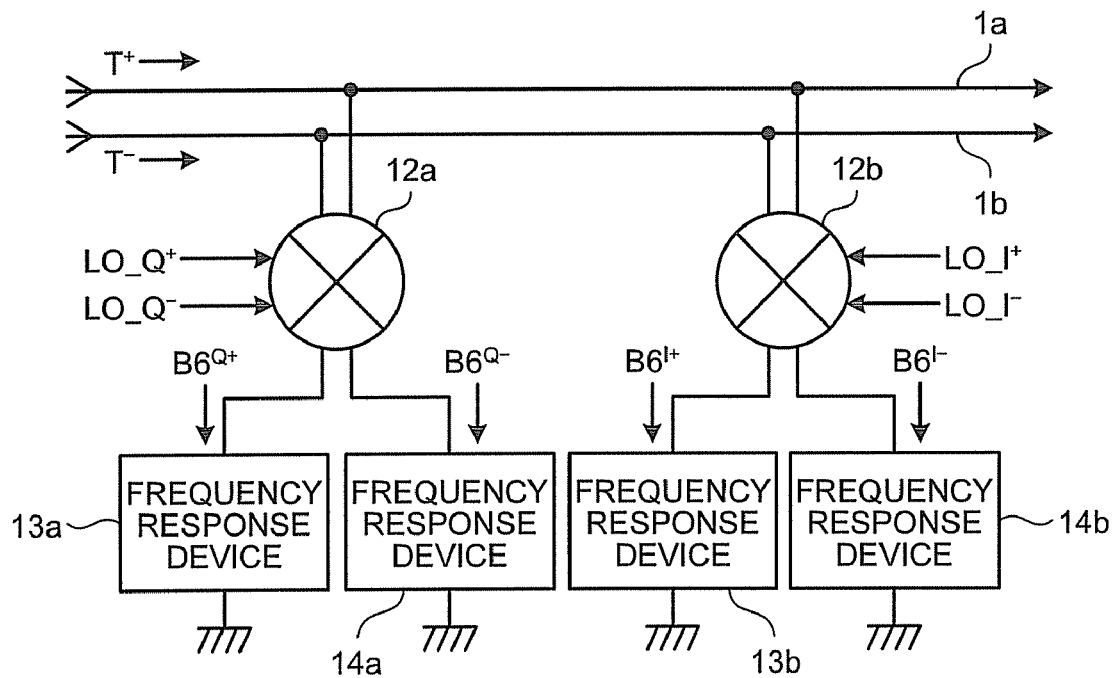
FIG. 15 is a block diagram of a filter circuit according to an eleventh embodiment of the present invention.

FIG. 15 is a block diagram of a filter circuit according to an eleventh embodiment of the present invention.

As shown in FIG. 15, the filter circuit according to the eleventh embodiment includes passive mixers 12a and 12b and frequency response devices 13a, 14a, 13b, and 14b. The input terminals of the passive mixer 12a are connected to transmission lines 1a and 1b, respectively, and the output terminals of the passive mixer 12a are grounded via the frequency response devices 13a and 14a, respectively. Similarly, the input terminals of the passive mixer 12b are connected to transmission lines 1a and 1b, respectively, and the output terminals of the passive mixer 12b are grounded via the frequency response devices 13b and 14b, respectively.

The passive mixer 12a can generate frequency-converted signals B6$^{Q+}$ and B6$^{Q-}$ by mixing input signals T⁺ and T⁻ that are transmitted through the transmission lines 1a and 1b, respectively, and local oscillation signals LO_Q⁺ and LO_Q⁻, respectively. The passive mixer 12a can shift a frequency characteristic F of the frequency response devices 13a and 14a to high frequency by a local oscillation frequency $f_{LO}$ of the local oscillation signals LO_Q⁺ and LO_Q⁻ by outputting the frequency-converted signals B6$^{Q+}$ and B6$^{Q-}$ to the frequency response devices 13a and 14a, respectively, and apply the frequency characteristic F that is shifted to high frequency on the input signals T⁺ and T⁻.

The passive mixer 12b can generate frequency-converted signals B6$^{I+}$ and B6$^{I-}$ by mixing input signals T⁺ and T⁻ that are transmitted through the transmission lines 1a and 1b, respectively, and local oscillation signals LO_I⁺ and LO_I⁻, respectively. The passive mixer 12b can shift a frequency characteristic F of the frequency response devices 13b and 14b to high frequency by a local oscillation frequency $f_{LO}$ of the local oscillation signals LO_I⁺ and LO_I⁻ by outputting the frequency-converted signals B6$^{I+}$ and B6$^{I-}$ to the frequency response devices 13b and 14b, respectively, and apply the frequency characteristic F that is shifted to high frequency on the input signals T⁺ and T⁻.

In other words, by applying the frequency characteristic F of the frequency response devices 13a and 14a on the frequency-converted signals B6$^{Q+}$ and B6$^{Q-}$, it is possible to apply a frequency characteristic F' which is the frequency characteristic F shifted to high frequency by the local oscillation frequency $f_{LO}$, on the quadrature phase components of the input signals T⁺ and T⁻. Similarly, by applying the frequency characteristic F of the frequency response devices 13b and 14b on the frequency-converted signals B6$^{I+}$ and B6$^{I-}$, it is possible to apply a frequency characteristic F' which is the frequency characteristic F shifted to high frequency by the local oscillation frequency $f_{LO}$, on the inphase components of the input signals T⁺ and T⁻.

Therefore, for the quadrature phase components and the inphase components of the input signals T⁺ and T⁻, the passive mixers 12a and 12b and the frequency response devices 13a, 14a, 13b, and 14b can operate as a filter circuit that has the frequency characteristic F' which is the frequency characteristic F shifted to high frequency by the local oscillation frequency $f_{LO}$. As a result, even when high-frequency differential signals are input as the quadrature phase components and the inphase components of the input signals T⁺ and T⁻, the center frequency of the filter circuit can be precisely matched to a target value, and at the same time, it is possible to make the attenuation characteristic steep and increase the attenuation amount for the input signal T⁺ and T⁻, and to increase the signal transmission speed while decreasing the common-mode noise.

Figure 16:
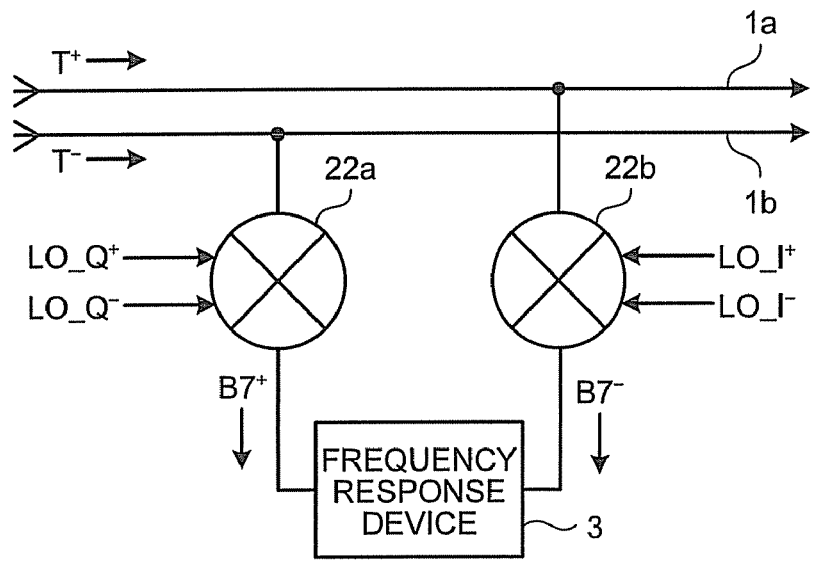
FIG. 16 is a block diagram of a filter circuit according to a twelfth embodiment of the present invention.

FIG. 16 is a block diagram of a filter circuit according to a twelfth embodiment of the present invention.

As shown in FIG. 16, the filter circuit according to the twelfth embodiment includes passive mixers 22a and 22b and a frequency response device 3. As for the passive mixers 22a and 22b, a single-phase passive mixer can be used. The passive mixer 22a can be used for quadrature phase signals, and the passive mixer 22b can be used for an inphase signal. The input terminal of the passive mixer 22a is connected to a transmission line 1b, and the input terminal of the passive mixer 22b is connected to a transmission line 1a. The output terminals of the passive mixers 22a and 22b are connected to each other via the frequency response device 3.

The passive mixer 22a can generate a frequency-converted signal B7⁺ by mixing an input signal T⁻ that is transmitted through the transmission line 1b and local oscillation signals LO_Q⁺ and LO_Q⁻, respectively. Similarly, the passive mixer 22b can generate a frequency-converted signal B7⁻ by mixing an input signal T⁺ that is transmitted through the transmission line 1a and local oscillation signals LO_I⁺ and LO_I⁻.

The passive mixers 22a and 22b can shift a frequency characteristic F of the frequency response device 3 to high frequency by a local oscillation frequency $f_{LO}$ of the local oscillation signals LO_Q$^+$, LO_Q$^-$, LO_I$^+$, and LO_I$^-$ by outputting the frequency-converted signals B7$^+$ and B7$^-$ to both terminals of the frequency response device 3, respectively, and apply the frequency characteristic F that is shifted to high frequency on the input signals T$^+$ and T$^-$.

In other words, by applying the frequency characteristic F of the frequency response device 3 on the frequency-converted signals B7$^+$ and B7$^-$, it is possible to apply a frequency characteristic F' which is the frequency characteristic F shifted to high frequency by the local oscillation frequency $f_{LO}$, on the quadrature phase components of the input signals T$^+$ and T$^-$.

Therefore, for the quadrature phase components and the inphase components of the input signals T$^+$ and T$^-$, the passive mixers 22a and 22b and the frequency response device 3 can operate as a filter circuit that has the frequency characteristic F' which is the frequency characteristic F shifted to high frequency by the local oscillation frequency $f_{LO}$, while preventing a part of the frequency characteristic from being canceled between the passive mixers 22a and 22b. As a result, even when high-frequency differential signals are input as the quadrature phase components and the inphase components of the input signals T$^+$ and T$^-$, the center frequency of the filter circuit can be precisely matched to a target value, and at the same time, it is possible to make the attenuation characteristic steep and increase the attenuation amount for the input signals T$^+$ and T$^-$, and to increase the signal transmission speed while decreasing the common-mode noise.

In the configuration shown in FIG. 14, the passive mixers 12a and 12b are connected to both the transmission lines 1a and 1b, respectively. Therefore, with the configuration shown in FIG. 14, even though it is a part of it, the frequency characteristic of the passive mixer 12a and the frequency characteristic of the passive mixer 12b are canceled with each other, so that the frequency characteristic becomes slightly mild, resulting in a degradation of the steepness of the attenuation characteristic compared to the configuration shown in FIG. 7. On the other hand, in the configuration shown in FIG. 16, the passive mixers 22a and 22b are connected to one side of the transmission lines 1a and 1b, respectively. For this reason, with the configuration shown in FIG. 16, the frequency characteristics of the passive mixers 22a and 22b are not canceled with each other, so that it is possible to prevent the frequency characteristic from being mild, making it possible to realize a steep attenuation characteristic similar to the case in the configuration shown in FIG. 7.

Figure 17:
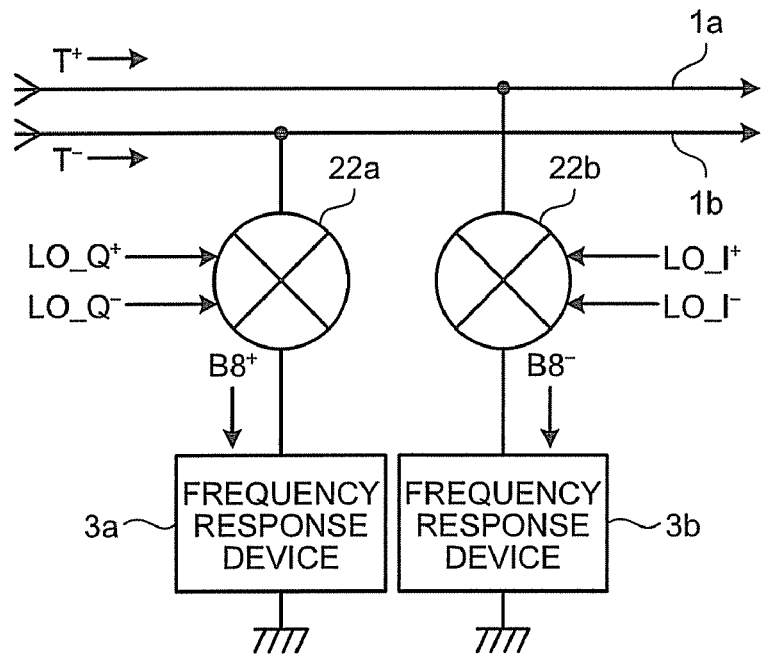
FIG. 17 is a block diagram of a filter circuit according to a thirteenth embodiment of the present invention.

FIG. 17 is a block diagram of a filter circuit according to a thirteenth embodiment of the present invention.

As shown in FIG. 17, the filter circuit according to the thirteenth embodiment includes passive mixers 22a and 22b and frequency response devices 3a and 3b. The input terminal of the passive mixer 22a is connected to a transmission line 1b, and the input terminal of the passive mixer 22b is connected to a transmission line 1a. The output terminals of the passive mixers 22a and 22b are grounded via the frequency response devices 3a and 3b, respectively.

The passive mixer 22a can generate a frequency-converted signal B8$^+$ by mixing an input signal T$^-$ that is transmitted through the transmission line 1b and local oscillation signals LO_Q$^+$ and LO_Q$^-$, respectively. Similarly, the passive mixer 22b can generate a frequency-converted signal B8$^-$ by mixing an input signal T$^+$ that is transmitted through the transmission line 1a and local oscillation signals LO_I$^+$ and LO_I$^-$.

The passive mixers 22a and 22b can shift a frequency characteristic F of the frequency response device 3a and 3b to high frequency by a local oscillation frequency $f_{LO}$ of the local oscillation signals LO_Q$^+$, LO_Q$^-$, LO_I$^+$, and LO_I$^-$ by outputting the frequency-converted signals B8$^+$ and B8$^-$ to the frequency response devices 3a and 3b, respectively, and apply the frequency characteristic F that is shifted to high frequency on the input signals T$^+$ and T$^-$.

In other words, by applying the frequency characteristic F of the frequency response devices 3a and 3b on the frequency-converted signals B8$^+$ and B8$^-$, it is possible to apply a frequency characteristic F' which is the frequency characteristic F shifted to high frequency by the local oscillation frequency $f_{LO}$, on the quadrature phase components of the input signals T$^+$ and T$^-$.

Therefore, for the quadrature phase components and the inphase components of the input signals T$^+$ and T$^-$, the passive mixers 22a and 22b and the frequency response devices 3a and 3b can operate as a filter circuit that has the frequency characteristic F' which is the frequency characteristic F shifted to high frequency by the local oscillation frequency $f_{LO}$, while preventing a part of the frequency characteristic from being canceled between the passive mixers 22a and 22b. As a result, even when high-frequency differential signals are input as the quadrature phase components and the inphase components of the input signals T$^+$ and T$^-$, the center frequency of the filter circuit can be precisely matched to a target value, and at the same time, it is possible to make the attenuation characteristic steep and increase the attenuation amount for the input signals T$^+$ and T$^-$, and to increase the signal transmission speed while decreasing the common-mode noise.

In the configuration shown in FIG. 15, the passive mixers 12a and 12b are connected to both the transmission lines 1a and 1b, respectively. Therefore, with the configuration shown in FIG. 15, even though it is a part of it, the frequency characteristic of the passive mixer 12a and the frequency characteristic of the passive mixer 12b are canceled with each other, so that the frequency characteristic becomes slightly mild, resulting in a degradation of the steepness of the attenuation characteristic compared to the configuration shown in FIG. 12. On the other hand, in the configuration shown in FIG. 17, the passive mixers 22a and 22b are connected to one side of the transmission lines 1a and 1b, respectively. For this reason, with the configuration shown in FIG. 17, the frequency characteristics of the passive mixers 22a and 22b are not canceled with each other, so that it is possible to prevent the frequency characteristic from being mild, making it possible to realize a steep attenuation characteristic similar to the case in the configuration shown in FIG. 12.

Figure 18:
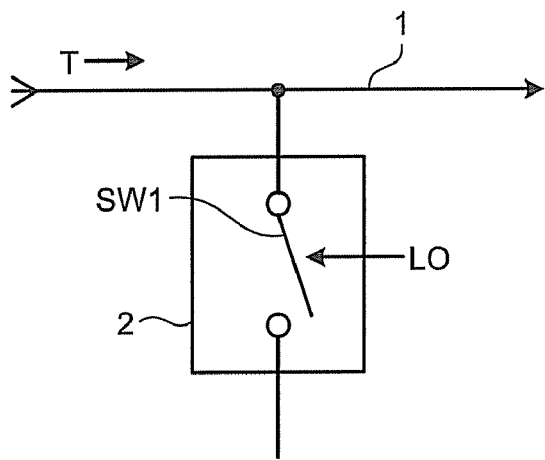
FIG. 18 is a block diagram of a passive mixer applied to a filter circuit according to a fourteenth embodiment of the present invention.

FIG. 18 is a block diagram of a passive mixer applied to a filter circuit according to a fourteenth embodiment of the present invention.

In FIG. 18, the passive mixer 2 shown in FIG. 1 is configured with a switch SW1. As for the switch SW1, a mechanical switch, such as a microelectoromechanical system (MEMS) switch and a relay switch, or a semiconductor switch, such as a field effect transistor, can be used.

A first terminal of the switch SW1 is connected to the transmission line 1, and a second terminal of the switch SW1 is connected to the frequency response device 3. The input signal T and the local oscillation signal LO are mixed by switching on and off the switch SW1 with the local oscillation signal LO, so that the mixed signal is output to the frequency response device 3.

The passive mixers 2a and 2b shown in FIG. 13 can be respectively configured with the switch SW1.

Figure 19:
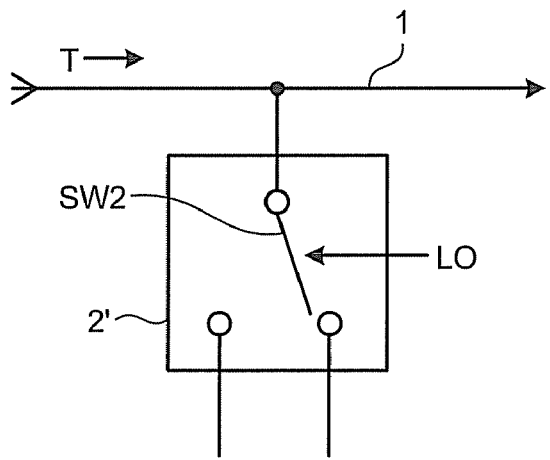
FIG. 19 is a block diagram of a passive mixer applied to a filter circuit according to a fifteenth embodiment of the present invention.

FIG. 19 is a block diagram of a passive mixer applied to a filter circuit according to a fifteenth embodiment of the present invention.

In FIG. 19, the passive mixer 2' shown in FIG. 6 is configured with a switch SW2. A first terminal of the switch SW2 is connected to the transmission line 1, one of second terminals of the switch SW2 is connected to the frequency response device 3a, and other of the second terminals of the switch SW2 is connected to the frequency response device 3b. The input signal T and the local oscillation signal LO are mixed by switching on and off the switch SW2 with the local oscillation signal LO, so that the mixed signal is output to the frequency response devices 3a and 3b.

Figure 20:
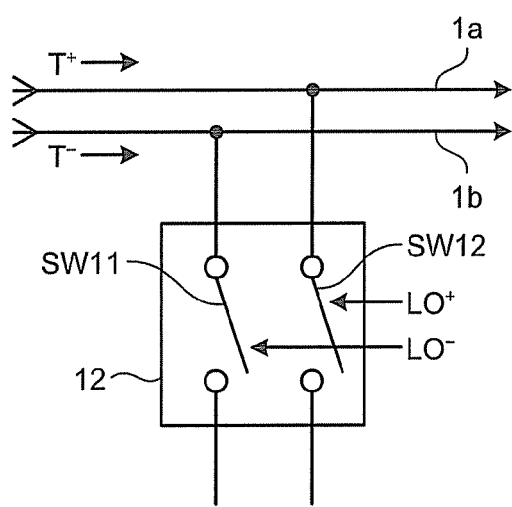
FIG. 20 is a block diagram of a passive mixer applied to a filter circuit according to a sixteenth embodiment of the present invention.

FIG. 20 is a block diagram of a passive mixer applied to a filter circuit according to a sixteenth embodiment of the present invention.

In FIG. 20, the passive mixer 12 shown in FIG. 7 is configured with switches SW11 and SW12. A first terminal of the switch SW11 is connected to the transmission line 1b, and a second terminal of the switch SW11 is connected to a first terminal of the frequency response device 3. Similarly, a first terminal of the switch SW12 is connected to the transmission line 1a, and a second terminal of the switch SW12 is connected to a second terminal of the frequency response device 3. The input signals $T^+$ and $T^-$ and the local oscillation signals $LO^+$ and $LO^-$ are mixed by switching on and off the switches SW11 and SW12 with the local oscillation signals $LO^+$ and $LO^-$, respectively, so that the mixed signal is output to the frequency response device 3.

Alternatively, the passive mixer 12 shown in FIG. 12 can be configured with the switches SW11 and SW12. In this case, the first terminal of the switch SW11 can be connected to the transmission line 1b, and the second terminal of the switch SW11 can be connected to the frequency response device 3a. Similarly, the first terminal of the switch SW12 can be connected to the transmission line 1a, and the second terminal of the switch SW12 can be connected to the frequency response device 3b. Then, the input signals $T^+$ and $T^-$ and the local oscillation signals $LO^+$ and $LO^-$ are mixed by switching on and off the switches SW12 and SW11 with the local oscillation signals $LO^+$ and $LO^-$, respectively, so that the mixed signals are output to the frequency response devices 3a and 3b, respectively.

Furthermore, the passive mixers 12a and 12b shown in FIGS. 14 and 15 can be respectively configured with the passive mixer 12 shown in FIG. 20. In this case, the local oscillation signals $LO\_Q^+$ and $LO\_Q$ can be used for a first passive mixer 12 instead of the local oscillation signals $LO^+$ and $LO^-$, and the local oscillation signals $LO\_I^+$ and $LO\_I^-$ can be used for a second passive mixer 12 instead of the local oscillation signals $LO^+$ and $LO^-$.

Moreover, the passive mixers 22a and 22b shown in FIGS. 16 and 17 can be configured with a common passive mixer 12 shown in FIG. 20. In this case, the local oscillation signals $LO\_I^+$ and $LO\_I^-$ or the local oscillation signals $LO\_Q^+$ and $LO\_Q$ can be used for the passive mixer 12 instead of the local oscillation signals $LO^+$ and $LO^-$.

Figure 21:
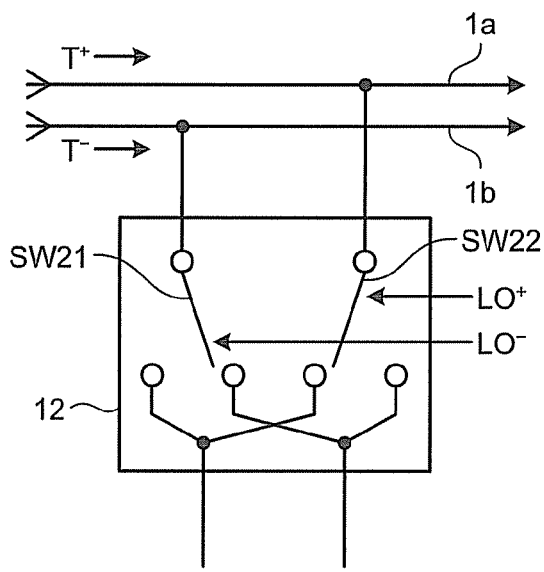
FIG. 21 is a block diagram of a passive mixer applied to a filter circuit according to a seventeenth embodiment of the present invention.

FIG. 21 is a block diagram of a passive mixer applied to a filter circuit according to a seventeenth embodiment of the present invention.

In FIG. 21, the passive mixer 12 shown in FIG. 7 is configured with switches SW21 and SW22. A first terminal of the switch SW21 is connected to the transmission line 1b, one of second terminals of the switch SW21 is connected to a first terminal of the frequency response device 3, and other of the second terminals of the switch SW21 is connected to a second terminal of the frequency response device 3. A first terminal of the switch SW22 is connected to the transmission line 1a, one of second terminals of the switch SW22 is connected to the first terminal of the frequency response device 3, and other of the second terminals of the switch SW22 is connected to the second terminal of the frequency response device 3. The input signals $T^+$ and $T^-$ and the local oscillation signals $LO^+$ and $LO^-$ are mixed by switching on and off the switches SW22 and SW21 with the local oscillation signals $LO^+$ and $LO^-$, respectively, so that the mixed signal is output to the frequency response device 3.

Alternatively, the passive mixer 12 shown in FIG. 12 can be configured with the switches SW21 and SW22. In this case, the first terminal of the switch SW21 can be connected to the transmission line 1b, one of the second terminals of the switch SW21 can be connected to a first terminal of the frequency response device 3a, and other of the second terminals of the switch SW21 can be connected to a first terminal of the frequency response device 3b. Similarly, the first terminal of the switch SW22 can be connected to the transmission line 1a, one of the second terminals of the switch SW22 can be connected to the first terminal of the frequency response device 3a, and other of the second terminals of the switch SW22 can be connected to the first terminal of the frequency response device 3b. Then, the input signals $T^+$ and T and the local oscillation signals $LO^+$ and $LO^-$ are mixed by switching on and off the switches SW22 and SW21 with the local oscillation signals $LO^+$ and $LO^-$, respectively, so that the mixed signals are output to the frequency response devices 3a and 3b, respectively.

Furthermore, the passive mixers 12a and 12b shown in FIGS. 14 and 15 can be respectively configured with the passive mixer 12 shown in FIG. 21. In this case, the local oscillation signals $LO\_Q^+$ and $LO\_Q^-$ can be used for a first passive mixer 12 instead of the local oscillation signals $LO^+$ and $LO^-$, and the local oscillation signals $LO\_I^+$ and $LO\_I^-$ can be used for a second passive mixer 12 instead of the local oscillation signals $LO^+$ and $LO^-$.

Moreover, the passive mixers 22a and 22b shown in FIGS. 16 and 17 can be configured with a common passive mixer 12 shown in FIG. 21. In this case, the local oscillation signals $LO\_I^+$ and $LO\_I^-$ or the local oscillation signals $LO\_Q^+$ and $LO\_Q^-$ can be used for the passive mixer 12 instead of the local oscillation signals $LO^+$ and $LO^-$.

Figure 22:
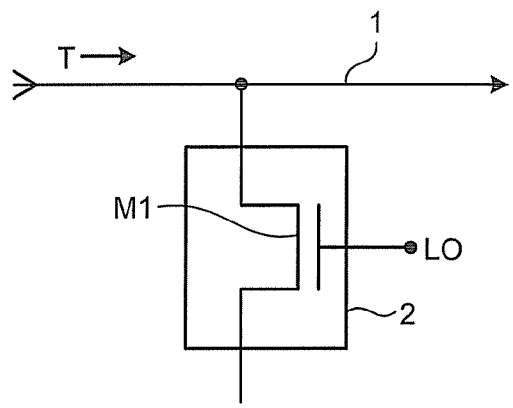
FIG. 22 is a block diagram of a passive mixer applied to a filter circuit according to an eighteenth embodiment of the present invention.

FIG. 22 is a block diagram of a passive mixer applied to a filter circuit according to an eighteenth embodiment of the present invention.

In FIG. 22, the passive mixer 2 shown in FIG. 1 is configured with a field effect transistor M1. The drain of the FET M1 is connected to the transmission line 1, and the source of the field effect transistor M1 is connected to the frequency response device 3. The local oscillation signal LO is input to the gate of the field effect transistor M1, and then, the input signal T and the local oscillation signal LO are mixed by switching on and off the field effect transistor M1 with the local oscillation signal LO.

Furthermore, the passive mixers 2a and 2b shown in FIG. 13 can be respectively configured with the field effect transistor M1.

Figure 23:
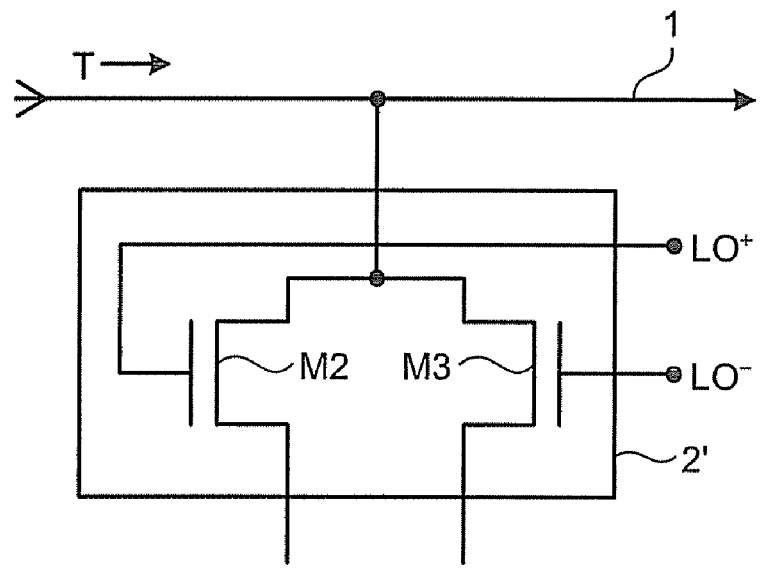
FIG. 23 is a block diagram of a passive mixer applied to a filter circuit according to a nineteenth embodiment of the present invention.

FIG. 23 is a block diagram of a passive mixer applied to a filter circuit according to a nineteenth embodiment of the present invention.

In FIG. 23, the passive mixer 2' shown in FIG. 6 is configured with field effect transistors M2 and M3. The drains of the field effect transistors M2 and M3 are commonly connected to the transmission line 1, the source of the field effect transistor M2 is connected to the frequency response device 3a, and the source of the field effect transistor M3 is connected to the frequency response device 3b. The input signal T and the local oscillation signals LO⁺ and LO⁻ are mixed inputting the local oscillation signals LO⁺ and LO⁻ to the gates of the field effect transistors M2 and M3, respectively, thus switching on and off the field effect transistors M2 and M3 with the local oscillation signals LO⁺ and LO⁻, respectively, so that the mixed signals are output to the frequency response devices 3a and 3b, respectively.

Figure 24:
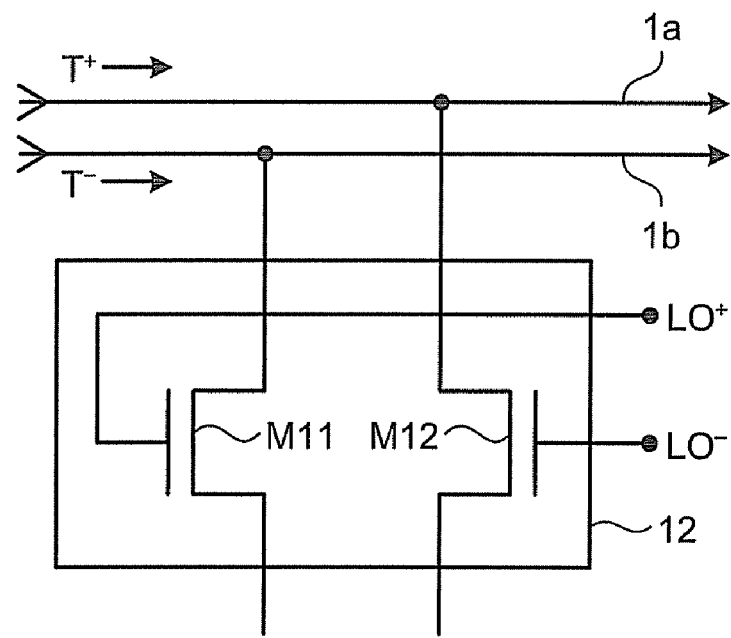
FIG. 24 is a block diagram of a passive mixer applied to a filter circuit according to a twentieth embodiment of the present invention.

FIG. 24 is a block diagram of a passive mixer applied to a filter circuit according to a twentieth embodiment of the present invention.

In FIG. 24, the passive mixer 12 shown in FIG. 7 is configured with field effect transistors M11 and M12. The drain of the field effect transistor M11 is connected to the transmission line 1b, and the source of the field effect transistor M11 is connected to a first terminal of the frequency response device 3. Similarly, the drain of the field effect transistor M12 is connected to the transmission line 1a, and the source of the field effect transistor M12 is connected to a second terminal of the frequency response device 3. The input signals T⁺ and T⁻ and the local oscillation signals LO⁺ and LO⁻ are mixed by inputting the local oscillation signals LO⁺ and LO⁻ to the gates of the field effect transistors M11 and M12, respectively, thus switching on and off the field effect transistors M11 and M12 with the local oscillation signals LO⁺ and LO⁻, respectively, so that the mixed signal is output to the frequency response device 3.

Alternatively, the passive mixer 12 shown in FIG. 12 can be configured with the field effect transistors M11 and M12. In this case, the drain of the field effect transistor M11 can be connected to the transmission line 1b, and the source of the field effect transistor M11 can be connected to a first terminal of the frequency response device 3a. Similarly, the drain of the field effect transistor M12 can be connected to the transmission line 1a, and the source of the field effect transistor M12 can be connected to a first terminal of the frequency response device 3b.

Furthermore, the passive mixers 12a and 12b shown in FIGS. 14 and 15 can be respectively configured with the passive mixer 12 shown in FIG. 24. Moreover, the passive mixers 22a and 22b shown in FIGS. 16 and 17 can be configured with a common passive mixer 12 shown in FIG. 24.

Figure 25:
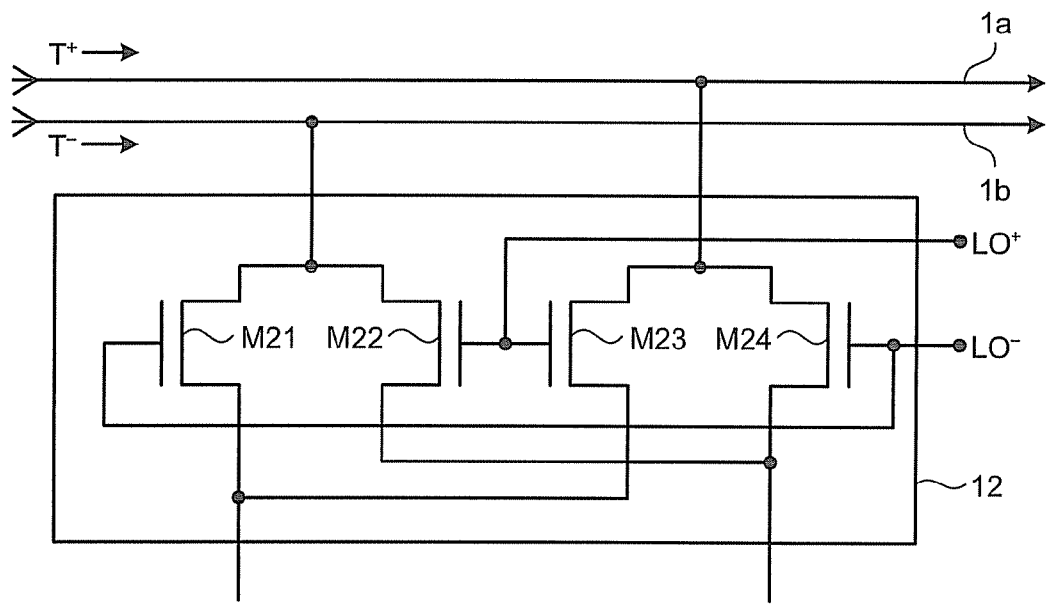
FIG. 25 is a block diagram of a passive mixer applied to a filter circuit according to a twenty-first embodiment of the present invention.

FIG. 25 is a block diagram of a passive mixer applied to a filter circuit according to a twenty-first embodiment of the present invention.

In FIG. 25, the passive mixer 12 shown in FIG. 7 is configured with field effect transistors M21 to M24. The drains of the field effect transistors M21 and M22 are commonly connected to the transmission line 1b, and the drains of the field effect transistors M23 and M24 are commonly connected to the transmission line 1a. The sources of the field effect transistors M21 and M23 are commonly connected to a first terminal of the frequency response device 3, and the sources of the field effect transistors M22 and M24 are commonly connected to a second terminal of the frequency response device 3. The gates of the field effect transistors M21 and M24 are connected to each other, and the gates of the field effect transistors M22 and M23 are connected to each other.

The input signals T⁺ and T⁻ and the local oscillation signals LO⁺ and LO⁻ are mixed by commonly inputting the local oscillation signal LO⁺ to the gates of the field effect transistors M22 and M23 and commonly inputting the local oscillation signal LO⁻ to the gates of the field effect transistors M21 and M24, thus switching on and off the field effect transistors M21 to M24 with the local oscillation signals LO⁺ and LO⁻, so that the mixed signal is output to the frequency response device 3.

Alternatively, the passive mixer 12 shown in FIG. 12 can be configured with the field effect transistors M21 to M24. Furthermore, the passive mixers 12a and 12b shown in FIGS. 14 and 15 can be respectively configured with the passive mixer 12 shown in FIG. 25.

Figure 26:
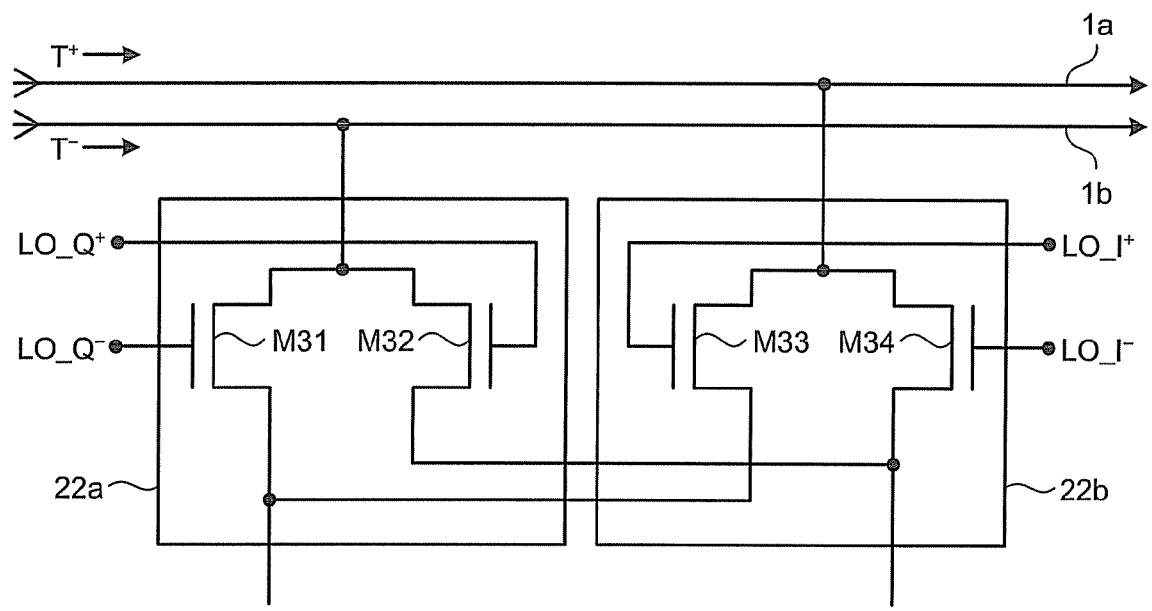
FIG. 26 is a block diagram of a passive mixer applied to a filter circuit according to a twenty-second embodiment of the present invention.

FIG. 26 is a block diagram of a passive mixer applied to a filter circuit according to a twenty-second embodiment of the present invention.

In FIG. 26, the passive mixer 22a shown in FIG. 16 is configured with field effect transistors M31 and M32, and the passive mixer 22b is configured with field effect transistors M33 and M34. The drains of the field effect transistors M31 and M32 are commonly connected to the transmission line 1b, and the drains of the field effect transistors M33 and M34 are commonly connected to the transmission line 1a. The sources of the field effect transistors M31 and M33 are commonly connected to a first terminal of the frequency response device 3, and the sources of the field effect transistors M32 and M34 are commonly connected to a second terminal of the frequency response device 3.

The input signals T⁺ and T⁻ and the local oscillation signals LO_Q⁺, LO_Q⁻, LO_I⁺, and LO_I⁻ are mixed by commonly inputting the local oscillation signals LO_Q⁺ and LO_Q⁻ to the gates of the field effect transistors M32 and M31, respectively, and commonly inputting the local oscillation signals LO_I⁺ and LO_I⁻ to the gates of the field effect transistors M33 and M34, respectively, thus switching on and off the field effect transistors M31 to M34 with the local oscillation signals LO_Q⁺, LO_Q⁻, LO_I⁺, and LO_I⁻, so that the mixed signal is output to the frequency response device 3.

Alternatively, the passive mixers 22a and 22b shown in FIG. 17 can be configured with the passive mixers 22a and 22b shown in FIG. 26. Furthermore, the passive mixers 22a and 22b shown in FIGS. 16 and 17 can be configured with a common passive mixer 12 shown in FIG. 26.

Figure 27:
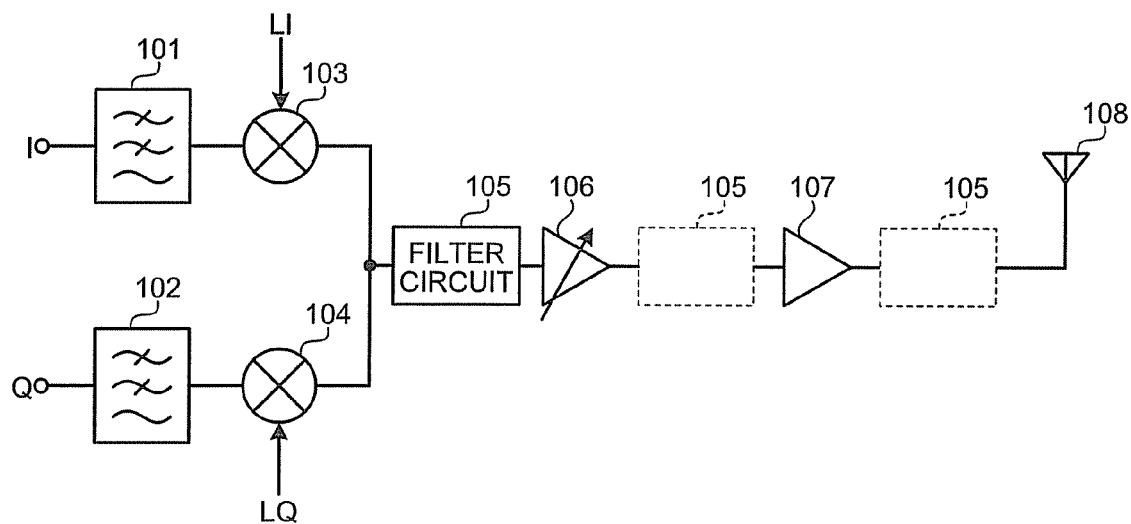
FIG. 27 is a block diagram of a wireless transmitter according to a twenty-third embodiment of the present invention to which the filter circuit according to the present invention is applied.

FIG. 27 is a block diagram of a wireless transmitter according to a twenty-third embodiment of the present invention to which the filter circuit according to the present invention is applied.

As shown in FIG. 27, the wireless transmitter according to the twenty-third embodiment includes up-converters 103 and 104 for performing an up-convert of a transmission signal. The input terminals of the up-converters 103 and 104 are connected to filter devices 101 and 102, respectively, and the output terminals of the up-converters 103 and 104 are commonly connected to a transmission antenna 108 via a filter circuit 105, a variable gain amplifier 106, and a power amplifier 107 in a sequential manner. As for the filter circuit 105, the filter circuit shown in any one of FIGS. 1, 6, 7, and 12 to 26 can be used.

When the filter circuit shown in any one of FIGS. 1, 6, 13, 18, 19, 22, and 23 is used as the filter circuit 105, the input terminal and the output terminal of the filter circuit 105 are connected to the transmission line 1 shown in the figures. Furthermore, when the filter circuit shown in any one of FIGS. 7, 12, 14, 15, 16, 17, 20, 21, 24, 25, and 26 is used as the filter circuit 105, the input terminal and the output terminal of the filter circuit 105 are connected to the transmission lines 1a and 1b shown in the figures.

An inphase component I of a baseband signal is input to the up-converter 103 after an unnecessary frequency component is eliminated at the filter device 101. The inphase component I of the baseband signal is up-converted by being mixed with a local oscillation signal L1 at the up-converter 103, so that the inphase component I of a radio-frequency signal is generated. The quadrature phase component Q of the baseband signal is input to the up-converter 104 after an unnecessary frequency component is eliminated at the filter device 102. The quadrature phase component Q of the baseband signal is up-converted by being mixed with a local oscillation signal LQ at the up-converter 104, so that the quadrature phase component Q of a radio-frequency signal is generated. As for the local oscillation signals L1 and LQ, signals having the same frequency with phases shifted by 90 degrees can be used.

The inphase component I and the quadrature phase component Q of the radio-frequency signal respectively generated at the up-converters 103 and 104 are amplified at the variable gain amplifier 106 and the power amplifier 107 after an unnecessary frequency component is eliminated at the filter circuit 105, respectively, and then transmitted through the space via the transmission antenna 108.

The up-converters 103 and 104 are used for up-converting the transmission signal, however, the passive mixer included in the filter circuit 105 is used for shifting the frequency characteristic of the frequency response device included in the filter circuit 105 to high frequency without up-converting the transmission signal.

Conventionally, an LC filter or a surface acoustic wave (SAW) filter is used in the filter circuit 105. However, in the LC filter, it is hard to precisely match the resonant frequency to a target value by an electronic control, to make the attenuation characteristic steep, and to increase the attenuation amount. In the SAW filter, it is not possible to vary the center frequency and to mount it on the same IC chip together with the other circuits. On the other hand, if the filter circuit shown in any one of FIGS. 1, 6, 7, and 12 to 26 is used as the filter circuit 105, it is possible to construct a filter circuit having a steep attenuation characteristic and a large attenuation amount on the same IC chip with the other circuits, so that an enhancement of performance can be realized at low cost.

Although a configuration in which the filter circuit 105 is arranged on the input side of the variable gain amplifier 106 in the twenty-third embodiment shown in FIG. 27, the filter circuit 105 can be arranged on the output side of the variable gain amplifier 106 or on the output side of the power amplifier 107. Furthermore, the filter circuit 105 can be arranged on the transmission line of a radio-frequency band, on the transmission line of an intermediate-frequency band, or on the transmission line of a baseband. In addition, the transmission line of the transmission signal can be a single-phase transmission line or a differential transmission line.

Figure 28:
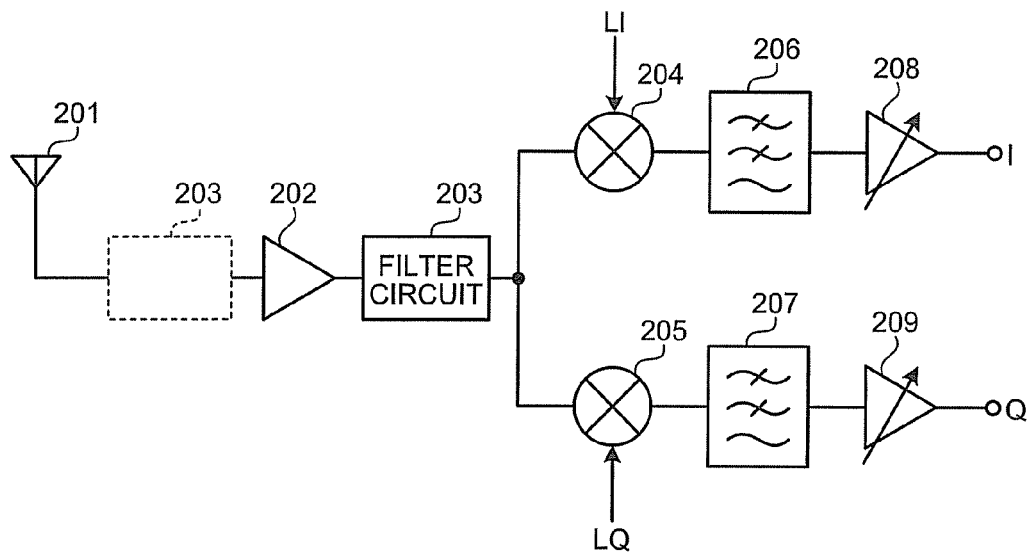
FIG. 28 is a block diagram of a wireless receiver according to a twenty-fourth embodiment of the present invention to which the filter circuit according to the present invention is applied.

FIG. 28 is a block diagram of a wireless receiver according to a twenty-fourth embodiment of the present invention to which the filter circuit according to the present invention is applied.

As shown in FIG. 28, the wireless receiver according to the twenty-fourth embodiment includes down-converters 204 and 205 for performing a down-convert of a reception signal. The input terminals of the down-converters 204 and 205 are commonly connected to a reception antenna 201 via a filter circuit 203 and a low-noise amplifier 202. The output terminals of the down-converters 204 and 205 are connected to variable gain amplifiers 208 and 209 via filter devices 206 and 207, respectively. As for the filter circuit 203, the filter circuit shown in any one of FIGS. 1, 6, 7, and 12 to 26 can be used.

When the filter circuit shown in any one of FIGS. 1, 6, 13, 18, 19, 22, and 23 is used as the filter circuit 203, the input terminal and the output terminal of the filter circuit 203 are connected to the transmission line 1 shown in the figures. Furthermore, when the filter circuit shown in any one of FIGS. 7, 12, 14, 15, 16, 17, 20, 21, 24, 25, and 26 is used as the filter circuit 203, the input terminal and the output terminal of the filter circuit 203 are connected to the transmission lines 1a and 1b shown in the figures.

A desired frequency component is selected by the filter circuit 203 from a radio-frequency signal received by the reception antenna 201 after being amplified at the low-noise amplifier 202, and input to the down-converters 204 and 205. The radio-frequency signal passed the filter circuit 203 is down-converted by being mixed with a local oscillation signal L1 at the down-converter 204, so that an inphase component I of a baseband signal is generated. Similarly, the radio-frequency signal passed the filter circuit 203 is down-converted at the down-converter 205 by being mixed with a local oscillation signal LQ, so that an quadrature phase component Q of the baseband signal is generated.

The inphase component I and the quadrature phase component Q of the baseband signal respectively generated at the down-converters 204 and 205 are amplified at the variable gain amplifiers 208 and 209 after an unnecessary frequency component is eliminated at the filter devices 206 and 207, respectively.

The down-converters 204 and 205 are used for down-converting the reception signal, however, the passive mixer included in the filter circuit 203 is used for shifting the frequency characteristic of the frequency response device included in the filter circuit 203 to high frequency without down-converting the reception signal.

Conventionally, an LC filter or a SAW filter is used in the filter circuit 203. However, in the LC filter, it is hard to precisely match the resonant frequency to a target value by an electronic control, to make the attenuation characteristic steep, and to increase the attenuation amount. In the SAW filter, it is not possible to vary the center frequency and to mount it on the same IC chip together with the other circuits. On the other hand, if the filter circuit shown in any one of FIGS. 1, 6, 7, and 12 to 26 is used as the filter circuit 203, it is possible to construct a filter circuit having a steep attenuation characteristic and a large attenuation amount on the same IC chip with the other circuits, so that an enhancement of performance can be realized at low cost.

Although a configuration in which the filter circuit 203 is arranged on the output side of the low-noise amplifier 202 in the twenty-fourth embodiment shown in FIG. 28, the filter circuit 203 can be arranged on the input side of the low-noise amplifier 202. Furthermore, the filter circuit 203 can be arranged on the transmission line of a radio-frequency band, on the transmission line of an intermediate-frequency band, or on the transmission line of a baseband. In addition, the transmission line of the reception signal can be a single-phase transmission line or a differential transmission line.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A filter circuit comprising:
  a frequency response device having a frequency characteristic; and
  a passive mixer that mixes an input signal and a local oscillation signal, and outputs a mixed signal to the frequency response device, thereby shifting the frequency characteristic of the frequency response device to high frequency by a local oscillation frequency of the local oscillation signal and applying the frequency characteristic shifted to high frequency on the input signal, wherein an input terminal of the passive mixer is connected to a transmission line through which the input signal is transmitted, and an output terminal of the passive mixer is connected to the frequency response device.

2. The filter circuit according to claim 1, wherein the passive mixer includes a field effect transistor, a drain of the field effect transistor is connected to the transmission line, a source of the field effect transistor is connected to the frequency response device, and the local oscillation signal is input to a gate of the field effect transistor.

3. A filter circuit comprising:

a frequency response device having a frequency characteristic; and a passive mixer that mixes an input signal and a local oscillation signal, and outputs a mixed signal to the frequency response device, thereby shifting the frequency characteristic of the frequency response device to high frequency by a local oscillation frequency of the local oscillation signal and applying the frequency characteristic shifted to high frequency on the input signal, wherein an input terminal of the passive mixer is connected to a transmission line through which the input signal is transmitted, an output terminal of the passive mixer is connected to the frequency response device, the input signal is a differential signal, and the passive mixer mixes the input signal and local oscillation signals having different phases by 180 degrees.

4. A filter circuit comprising:

a frequency response device having a frequency characteristic; and a passive mixer that mixes an input signal and a local oscillation signal, and outputs a mixed signal to the frequency response device, thereby shifting the frequency characteristic of the frequency response device to high frequency by a local oscillation frequency of the local oscillation signal and applying the frequency characteristic shifted to high frequency on the input signal, wherein an input terminal of the passive mixer is connected to a transmission line through which the input signal is transmitted, an output terminal of the passive mixer is connected to the frequency response device, the input signal is a differential signal, the passive mixer mixes the input signal and local oscillation signals having different phases by 180 degrees, the passive mixer is a differential passive mixer, and frequency-converted signals output from the differential passive mixer are input to terminals of the frequency response device, respectively.

5. The filter circuit according to claim 4, wherein the passive mixer includes a first field effect transistor and a second field effect transistor, a drain of the first field effect transistor is connected to a first transmission line through which a first signal of the differential signal is transmitted, a source of the first field effect transistor is connected to a first terminal of the frequency response device, a drain of the second field effect transistor is connected to a second transmission line through which a second signal of the differential signal is transmitted, a source of the second field effect transistor is connected to a second terminal of the frequency response device, and a phase of a local oscillation signal input to a gate of the first field effect transistor is different from a phase of a local oscillation signal input to a gate of the second field effect transistor by 180 degrees.

6. A filter circuit comprising:

a frequency response device having a frequency characteristic; and a passive mixer that mixes an input signal and a local oscillation signal, and outputs a mixed signal to the frequency response device, thereby shifting the frequency characteristic of the frequency response device to high frequency by a local oscillation frequency of the local oscillation signal and applying the frequency characteristic shifted to high frequency on the input signal, wherein an input terminal of the passive mixer is connected to a transmission line through which the input signal is transmitted, an output terminal of the passive mixer is connected to the frequency response device, the input signal is a differential signal, the passive mixer mixes the input signal and local oscillation signals having different phases by 180 degrees, the passive mixer is a differential passive mixer, frequency-converted signals output from the differential passive mixer are input to terminals of the frequency response device, respectively, the passive mixer includes a first field effect transistor, a second field effect transistor, a third field effect transistor, and a fourth field effect transistor, a drain of the first field effect transistor is connected to a first transmission line through which a first signal of the differential signal is transmitted, a source of the first field effect transistor is connected to a first terminal of the frequency response device, a drain of the second field effect transistor is connected to the drain of the first field effect transistor, a source of the second field effect transistor is connected to a second terminal of the frequency response device, a drain of the third frequency response device is connected to a second transmission line through which a second signal of the differential signal is transmitted, a source of the third field effect transistor is connected to the source of the first field effect transistor, a drain of the fourth field effect transistor is connected to the drain of the third field effect transistor, a source of the fourth field effect transistor is connected to the source of the second field effect transistor, and a phase of a local oscillation signal input to gates of the first field effect transistor and the fourth field effect transistor is different from a phase of a local oscillation signal input to gates of the second field effect transistor and the third field effect transistor by 180 degrees.

7. The filter circuit according to claim 3, wherein the passive mixer is a differential passive mixer, and the frequency response device includes a first frequency response device to which a first frequency-converted signal output from the differential passive mixer is input, and a second frequency response device to which a second frequency-converted signal output from the differential passive mixer is input.

8. The filter circuit according to claim 1, wherein
the passive mixer includes a first passive mixer for an inphase signal and a second passive mixer for an quadrature phase signal,
the first passive mixer and the second passive mixer mix the input signal and local oscillation signals having different phases by 90 degrees, respectively.

9. The filter circuit according to claim 8, wherein
the input signal is a differential signal, and
each of the first passive mixer and the second passive mixer is a single-phase passive mixer.

10. The filter circuit according to claim 9, wherein
a first signal of the differential signal is input to the first passive mixer,
a second signal of the differential signal is input to the second passive mixer,
a frequency-converted signal output from the first passive mixer is input to a first terminal of the frequency response device, and
a frequency-converted signal output from the second passive mixer is input to a second terminal of the frequency response device.

11. The filter circuit according to claim 10, wherein
the passive mixer includes a first field effect transistor, a second field effect transistor, a third field effect transistor, and a fourth field effect transistor,
a drain of the first field effect transistor is connected to a first transmission line through which the first signal of the differential signal is transmitted,
a source of the first field effect transistor is connected to the first terminal of the frequency response device,
a drain of the second field effect transistor is connected to the drain of the first field effect transistor,
a source of the second field effect transistor is connected to the second terminal of the frequency response device,
a drain of the third frequency response device is connected to a second transmission line through which the second signal of the differential signal is transmitted,
a source of the third field effect transistor is connected to the source of the first field effect transistor,
a drain of the fourth field effect transistor is connected to the drain of the third field effect transistor,
a source of the fourth field effect transistor is connected to the source of the second field effect transistor, and
phases of local oscillation signals input to gates of the first field effect transistor, the second field effect transistor, the third field effect transistor, and the fourth field effect transistor are sequentially different from each other by 90 degrees.

12. The filter circuit according to claim 9, wherein
a first signal of the differential signal is input to the first passive mixer,
a second signal of the differential signal is input to the second passive mixer, and
the frequency response device includes
a first frequency response device to which a frequency-converted signal output from the first passive mixer is input, and
a second frequency response device to which a frequency-converted signal output from the second passive mixer is input.

13. The filter circuit according to claim 8, wherein
the input signal is a differential signal, and
each of the first passive mixer and the second passive mixer is a differential passive mixer.

14. The filter circuit according to claim 13, wherein
the passive mixer is a differential passive mixer, and
the frequency response device includes
a first frequency response device to which a pair of first frequency-converted signals output from the first passive mixer is input, and
a second frequency response device to which a pair of second frequency-converted signals output from the second passive mixer is input.

15. The filter circuit according to claim 13, wherein the frequency response device includes
a first frequency response device to which a first frequency-converted signal output from the first passive mixer is input,
a second frequency response device to which a second frequency-converted signal output from the first passive mixer is input,
a third frequency response device to which a first frequency-converted signal output from the second passive mixer is input, and
a fourth frequency response device to which a second frequency-converted signal output from the second passive mixer is input.

* * * * *